(12) United States Patent
Yang et al.

(10) Patent No.: US 12,538,684 B2
(45) Date of Patent: Jan. 27, 2026

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guobo Yang, Beijing (CN); Yue Long, Beijing (CN); Feng Wei, Beijing (CN); Benlian Wang, Beijing (CN); Binyan Wang, Beijing (CN); Guoqiang Tang, Beijing (CN); Yao Huang, Beijing (CN); Weiyun Huang, Beijing (CN); Pinchao Gu, Beijing (CN); Kuo Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 938 days.

(21) Appl. No.: 17/764,852

(22) PCT Filed: May 13, 2021

(86) PCT No.: PCT/CN2021/093611
§ 371 (c)(1),
(2) Date: Mar. 29, 2022

(87) PCT Pub. No.: WO2021/244251
PCT Pub. Date: Dec. 9, 2021

(65) Prior Publication Data
US 2022/0352292 A1    Nov. 3, 2022

(30) Foreign Application Priority Data
Jun. 1, 2020   (CN) .......................... 202010483701.0

(51) Int. Cl.
*H10K 59/35*    (2023.01)
*H10K 59/122*   (2023.01)
(Continued)

(52) U.S. Cl.
CPC ......... *H10K 59/353* (2023.02); *H10K 59/122* (2023.02); *H10K 59/131* (2023.02); *H10K 59/65* (2023.02)

(58) Field of Classification Search
None
See application file for complete search history.

(56) References Cited

U.S. PATENT DOCUMENTS 9,823,789 B2     11/2017  Ding et al.
2018/0219058 A1*  8/2018  Xiang ................ H10K 59/1315
(Continued)

FOREIGN PATENT DOCUMENTS

CN     103970392 A    8/2014
CN     111028692 A    4/2020
(Continued)

OTHER PUBLICATIONS

Extended European Search Report for corresponding European Application No. 21817199.9, dated Nov. 29, 2022.

*Primary Examiner* — Steven B Gauthier
(74) *Attorney, Agent, or Firm* — LEASON ELLIS LLP

(57) ABSTRACT

A display substrate and a display device including a base substrate, a plurality of first connection wirings, and a plurality of second connection wirings. The base substrate includes a display area including a first display area and a second display area, the first display area includes a plurality of first light-emitting devices and a plurality of second light-emitting devices, and the second display area includes a plurality of first pixel circuits and a plurality of second pixel circuits. At least a portion of the plurality of first (Continued)

connection wirings extends along a first direction, at least a portion of the plurality of second connection wirings extends along the first direction, at least a portion of the plurality of first connection wirings is located on a first side of a row provided with first electrodes of the plurality of first and second light-emitting devices in a second direction.

20 Claims, 10 Drawing Sheets

(51) Int. Cl.
*H10K 59/131* (2023.01)
*H10K 59/65* (2023.01)

(56) References Cited

U.S. PATENT DOCUMENTS

| | | |
|---|---|---|
| 2020/0052048 A1 | 2/2020 | Kuo et al. |
| 2020/0105843 A1 | 4/2020 | Baek et al. |
| 2021/0215982 A1 | 7/2021 | Ouyang et al. |
| 2022/0035408 A1 | 2/2022 | Ma et al. |
| 2022/0157895 A1 | 5/2022 | Xu et al. |

FOREIGN PATENT DOCUMENTS

| | | |
|---|---|---|
| CN | 111028765 A | 4/2020 |
| CN | 111048005 A | 4/2020 |
| CN | 111123587 A | 5/2020 |

\* cited by examiner

DISPLAY SUBSTRATE AND DISPLAY DEVICE

CROSS-REFERENCE TO RELATED PATENT APPLICATIONS

This application is a U.S. National Stage Application under 35 U.S.C. § 371 of International Patent Application No. PCT/CN2021/093611 filed May 13, 2021, which claims priority to the Chinese patent application No. 202010483701.0, filed Jun. 1, 2020, both of which are incorporated herein by reference in their entireties as a part of the present application. The International Application was published on Dec. 9, 2021, as International Publication No. WO/2021/244251 A1.

TECHNICAL FIELD

Embodiments of the present disclosure relate to a display substrate and a display device.

BACKGROUND

Currently, display screens for electronic devices are developed towards large screen and full screen to enable users with better visual experience. For example, for electronic products, such as mobile phones and tablets as, because these electronic devices need to be combined with components, such as cameras and light sensors, and these components typically occupy display areas of the display screens, the full-screen design of the display screen is difficult to realized. In order to improve the light transmittance of the area provided with the camera in the display screen and guarantee the photographing effect of the camera, only light-emitting elements of pixel circuits are retained in the area provided with the camera.

SUMMARY

At least one embodiment of the present disclosure provides a display substrate, including a first side for display and a second side opposite to the first side, comprising: a base substrate, a plurality of first connection lines and a plurality of second connection lines. The base substrate comprises a display area including a first display area and a second display area which at least partially surrounds the first display area, the first display area includes a first subpixel array and allows light from the first side of the display substrate to be at least partially transmitted to the second side of the display substrate, the first subpixel array includes a plurality of light-emitting elements arranged in an array, and the plurality of light-emitting elements include a plurality of first light-emitting elements and a plurality of second light-emitting elements; the second display area includes a first pixel circuit array which includes a plurality of first pixel circuit units, and the plurality of first pixel circuit units include a plurality of first pixel circuits and a plurality of second pixel circuits; the plurality of first connection lines are at least partially extended along a first direction and connected with the plurality of first pixel circuits and the plurality of first light-emitting elements in one-to-one correspondence, and the first pixel circuit is configured to drive the first light-emitting elements through the first connection lines; and the plurality of second connection lines are at least partially extended along the first direction and connected with the plurality of second pixel circuits and the plurality of second light-emitting elements in one-to-one correspondence, and the second pixel circuit is configured to drive the second light-emitting elements through the second connection lines; each of the plurality of light-emitting elements includes a first electrode, and the first electrodes of the plurality of first light-emitting elements and the plurality of second light-emitting elements are arranged in the same row along the first direction; in the first display area, the plurality of first connection lines are at least partially provided on a first side of a row provided with the first electrodes of the plurality of first light-emitting elements and the plurality of second light-emitting elements in a second direction, and the plurality of first connection lines are at least partially provided on a second side of the row provided with the first electrodes of the plurality of first light-emitting elements and the plurality of second light-emitting elements in a second direction; the second direction is intercrossed with the first direction, and the first side and the second side of the row provided with the first electrodes of the plurality of first light-emitting elements and the plurality of second light-emitting elements are opposite to each other in the second direction.

For example, in the display substrate provided in at least one embodiment of the present disclosure, in the first direction, the plurality of first light-emitting elements are provided on a side of the plurality of second light-emitting elements near the second display area.

For example, in the display substrate provided in at least one embodiment of the present disclosure, each of the plurality of first connection lines includes a first main part and at least one first bending part; the first main part is extended along the first direction and disposed on the first side of the row provided with the first electrodes of the plurality of first light-emitting elements and the plurality of second light-emitting elements, and the first main parts are connected with the first electrodes of the plurality of first light-emitting elements in one-to-one correspondence; and the at least one first bending part is connected with the first pixel circuit and the first main parts respectively and is extended to the first side of the first pixel circuit from the first pixel circuit so that the first main parts are away from the first electrodes of the plurality of the first light-emitting elements in the first display area.

For example, in the display substrate provided in at least one embodiment of the present disclosure, the at least one first bending part is at least partially extended towards the first side of the first pixel circuit along a third direction; and the third direction is intercrossed with the first direction and the second direction.

For example, in the display substrate provided in at least one embodiment of the present disclosure, the at least one first bending part of at least one of the plurality of first connection lines includes a first bending sub-part; the first bending sub-part is disposed on the first side of the first pixel circuit and is extended along the third direction and is connected with the first pixel circuit and the first main part; and one of the first pixel circuits connected with the first bending sub-part is adjacent to the second pixel circuit.

For example, in the display substrate provided in at least one embodiment of the present disclosure, the at least one first bending part of at least one of the plurality of first connection lines is extended to the first side of the first pixel circuit from a second side of the first pixel circuit and includes a second bending sub-part, a third bending sub-part, a first connection sub-part, and a second connection sub-part; the first connection sub-part and the second bending sub-part are disposed on the second side of the first pixel circuit, the second bending sub-part is extended along the third direction, and the first connection sub-part is extended along the first direction and connected with the first pixel circuit and the second bending sub-part; the second connection sub-part is extended along the second direction and disposed between two adjacent first pixel circuits and is connected with the second bending sub-part and the third bending sub-part; the third bending sub-part is disposed on the first side of the first pixel circuit and is extended along the third direction and connected with the first main part of the first connection line; and the second side and the first side of the first pixel circuit are opposite to each other in the second direction.

For example, in the display substrate provided in at least one embodiment of the present disclosure, the at least one first bending part of the at least one of the plurality of first connection lines includes a second bending sub-part, a third bending sub-part, a first connection sub-part, and a second connection sub-part, the first connection sub-part and the second bending sub-part are disposed on the second side of the first pixel circuit, the second bending sub-part is extended along the third direction, and the first connection sub-part is extended along the first direction and connected with the first pixel circuit and the second bending sub-part; the second connection sub-part is extended along the second direction and disposed between the first pixel circuit and the second subpixel circuit which are adjacent to each other and is connected with the second bending sub-part and the third bending sub-part; the third bending sub-part is disposed on the first side of the first pixel circuit and is extended along the third direction and is connected with the first main part of the first connection line; and the second side and the first side of the first pixel circuit are opposite to each other in the second direction.

For example, in the display substrate provided in at least one embodiment of the present disclosure, each of the plurality of second connection lines includes a second main part; the second main part is extended along the first direction and is disposed on the second side of the row provided with the first electrodes of the plurality of first light-emitting elements and the plurality of second light-emitting elements and is connected with the first electrode of the second light-emitting element and the second pixel circuit; and in the first display area, an orthographic projection of the main part of the second connection line on the base substrate is overlapped with an orthographic projection of the first electrode of at least one of the plurality of second light-emitting elements and the plurality of first light-emitting elements on the base substrate.

For example, in the display substrate provided in at least one embodiment of the present disclosure, the first main parts of the plurality of first connection lines are parallel to the second main parts of the plurality of second connection lines in the first direction.

For example, in the display substrate provided in at least one embodiment of the present disclosure, the plurality of first connection lines and the plurality of second connection lines are transparent conductive lines.

For example, the display substrate provided in at least one embodiment of the present disclosure further comprises a first insulating layer, a second insulating layer, a third insulating layer, a first transparent line layer, and a second transparent line layer, wherein the first insulating layer is disposed on a side of the plurality of first pixel circuits and the plurality of second pixel circuits away from the base substrate, the second insulating layer is disposed on a side of the first insulating layer away from the base substrate, the third insulating layer is disposed on a side of the second insulating layer away from the base substrate, the first transparent line layer is disposed between the first insulating layer and the second insulating layer, the second transparent line layer is disposed on the side of the second insulating layer away from the base substrate, and the first electrodes of the plurality of first light-emitting elements are disposed on a side of the third insulating layer away from the base substrate; the first transparent line layer includes one of two adjacent first connection lines of the plurality of first connection lines and one of two adjacent second connection lines of the plurality of second connection lines, and the second transparent line layer includes the other one of the two adjacent first connection lines of the plurality of first connection lines and the other one of the two adjacent second connection lines of the plurality of second connection lines.

For example, the display substrate provided in at least one embodiment of the present disclosure further comprises a plurality of pixel circuit connecting holes which are formed in the second display area and include a plurality of first pixel circuit connecting holes and a plurality of second pixel circuit connecting holes. The first pixel circuit connecting hole runs through the first insulating layer, the second pixel circuit connecting hole runs through the first insulating layer and the second insulating layer; the first connection line and the second connection line disposed on the first transparent line layer are respectively connected with the first pixel circuit and the second pixel circuit through the first pixel circuit connecting hole; and the first connection line and the second connection line disposed on the second transparent line layer are respectively connected with the first pixel circuit and the second pixel circuit through the second pixel circuit connecting hole.

For example, the display substrate provided in at least one embodiment of the present disclosure further comprises a plurality of electrode connecting holes which are formed in the first display area and are disposed on the first side of the row provided with the first electrodes of the plurality of first light-emitting elements and the plurality of second light-emitting elements and include a plurality of first electrode connecting holes and a plurality of second electrode connecting holes, each of the first electrode connecting holes runs through the second insulating layer and the third insulating layer, and each of the second electrode connecting hole runs through the third insulating layer; the first connection line and the second connection line disposed on the first transparent line layer are respectively connected with the first electrodes of the first light-emitting element and the second light-emitting element through the first electrode connecting holes, respectively; and the first connection line and the second connection line disposed on the second transparent line layer are respectively connected with the first electrodes of the first light-emitting element and the second light-emitting element through the second electrode connecting holes.

For example, the display substrate provided in at least one embodiment of the present disclosure further comprises at least one first virtual line disposed in the first display area, the at least one first virtual line is disposed between the first electrodes of the plurality of first light-emitting elements and the plurality of second light-emitting elements in adjacent rows and is extended along the second direction; the at least one first virtual line is connected with one end of the second connection line connected with the electrode connecting hole and is extended towards a direction away from the first electrode of the second light-emitting element from the electrode connecting hole; and an orthographic projection of the at least one first virtual line on the base substrate is not overlapped with the first connection line and the second connection line.

For example, the display substrate provided in at least one embodiment of the present disclosure further comprises a pixel define layer (PDL), the PDL is disposed on a side of the first electrodes of the plurality of light-emitting elements away from the base substrate and includes a plurality of first pixel openings, the plurality of first pixel openings correspond to the plurality of light-emitting elements one to one, respectively, to form light-emitting areas of the plurality of light-emitting elements; each of the plurality of light-emitting elements further includes a first light-emitting layer and a second electrode, the second electrode is disposed on a side of the PDL away from the base substrate, and the first light-emitting layer is disposed in the first pixel openings and disposed between the first electrode and the second electrode; the first electrode of at least part of the plurality of light-emitting elements includes a first electrode main part and a first electrode connection part; and the first electrode main part is disposed in the light-emitting area of the light-emitting element, and the first electrode connection part is connected with the electrode connecting hole and the first electrode main part.

For example, in the display substrate provided in at least one embodiment of the present disclosure, the second display area further includes a second subpixel array which includes a plurality of first pixel units, and the plurality of first pixel units and the plurality of first pixel circuit units are alternately arranged; each of the plurality of first pixel units includes a third light-emitting element and a third pixel circuit, and the third pixel circuit is electrically connected with the third light-emitting element to drive the third light-emitting element; the first subpixel array and the second subpixel array include a plurality of first subpixels, a plurality of second subpixels, and a plurality of third subpixels; and each pixel of the first subpixel array and the second subpixel array includes at least one first subpixel, at least one second subpixel, and at least one third subpixel.

For example, in the display substrate provided in at least one embodiment of the present disclosure, the display area further includes a third display area, the third display area at least partially surrounds the second display area, and the third display area includes a third subpixel array which includes a plurality of second pixel units; each of the plurality of second pixel units includes a fourth light-emitting element and a fourth pixel circuit, the fourth pixel circuit is electrically connected with the fourth light-emitting element to drive the fourth light-emitting element; the third subpixel array includes a plurality of first subpixels, a plurality of second subpixels, and a plurality of third subpixels; one of two adjacent pixels of the third subpixel array includes at least one first subpixel and at least one second subpixel, and the other one of the two adjacent pixels includes at least one first subpixel and at least one third subpixel, and each second subpixel and each third subpixel are respectively shared by at least two adjacent pixels.

For example, in the display substrate provided in at least one embodiment of the present disclosure, the first subpixels are green subpixels, the second subpixels are red subpixels, and the third subpixels are blue subpixels.

At least one embodiment of the present disclosure also provides a display device, comprising any of the display substrates above.

For example, the display device provided by at least one embodiment of the present disclosure further comprises a sensor, the sensor is disposed on the second side of the display substrate and is configured to receive light from the first side of the display substrate.

For example, in the display device provided by at least one embodiment of the present disclosure, an orthographic projection of the sensor on the base substrate is at least partially overlapped with the first display area.

BRIEF DESCRIPTION OF THE DRAWINGS

In order to clearly illustrate the technical solutions of the embodiments of the present disclosure, the drawings of the embodiments will be briefly described below. It is apparent that the described drawings are only related to some embodiments of the present disclosure and thus are not limitative of the present disclosure.

DETAILED DESCRIPTION

Figure 1A:
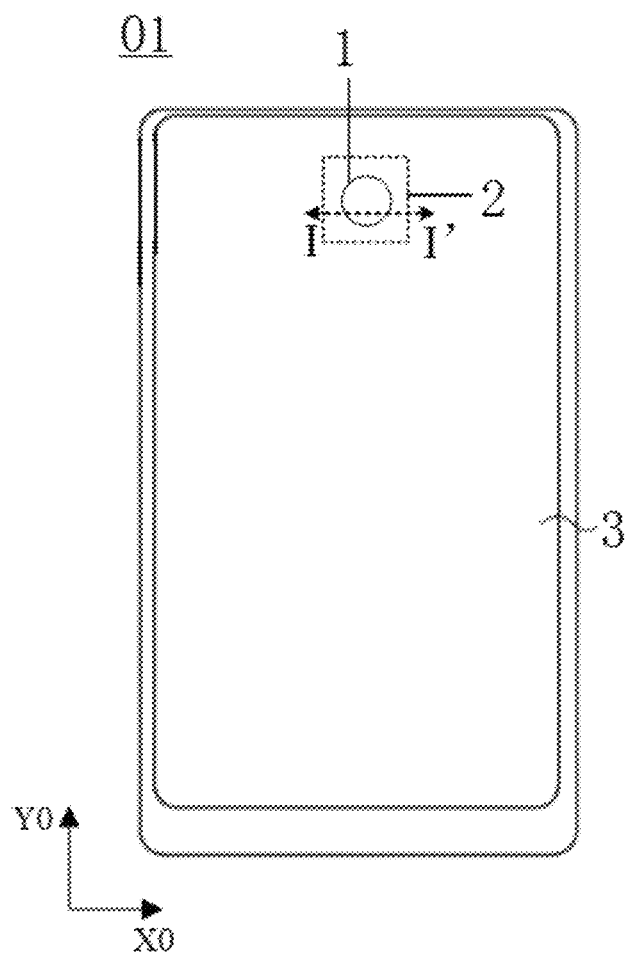
FIG. 1A is a schematic plan view of a display substrate.

In order to make the objective, technical solution, and advantages of embodiments of the present disclosure clearer, the technical solutions of the embodiments will be described in a clearly and fully understandable way in connection with the related drawings. It is apparent that the described embodiments are just a part but not all of the embodiments of the present disclosure. Based on the described embodiments herein, a person of ordinary skill in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the present disclosure, are not intended to indicate any sequence, amount or importance, but for distinguishing various components. Also, the terms, such as "a," "an," "the," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms. For the convenience of description, in some drawings, "upper", "lower", "front" and "rear" are given. In the embodiments of the present disclosure, the vertical direction is the direction from "upper" to "lower", and the vertical direction is the direction of gravity, the horizontal direction is the direction perpendicular to the vertical direction, and the horizontal direction from right to left is the direction from front to back.

In order to maximize the screen-to-body ratio of mobile display products, techniques, for example, bang screen, water drop screen, and hole-in screen emerge in succession. Such techniques can be used to mount components, such as sensors (e.g., an image sensor, an infrared sensor, a distance sensor) through a hole digging in part of a display area. The part of the display area is designed as a light transmissive display area, and a camera is disposed below to reduce the screen-to-body ratio caused by the fact that the camera occupies the border. Therefore, the light transmissive display area can realize the display function and provide convenience for the installation of the components, such as the sensors, and then these sensors can execute the functions, such as imaging, infrared induction, and distance sensing, through the light transmissive display area substantially without affecting the display function of the light transmissive display area, thereby helping to realize an electronic device with full screen.

However, the above technique also needs to dig out part of the display area, and the overall effect is the formation of an irregular display area, which affects the visual experience. In order to avoid the sacrifice of the display area, the technique to reduce the pixels per inch (PPI) in partial area and increase the light transmittance to place the camera emerges. The camera is placed in an area with low PPI. In the area, due to the PPI is lower and high light transmittance, light can arrive at the camera through the low-PPI area. However, although the light transmittance is improved, a grating formed by horizontally and vertically intercrossed lines of pixel drive circuits will still affect the imaging of the camera.

Figure 1B:
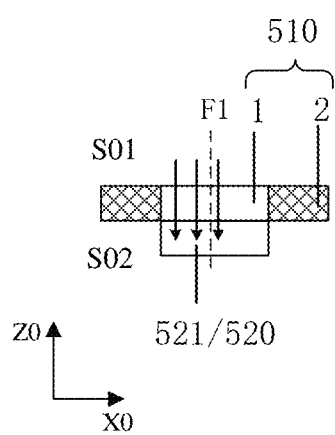
FIG. 1B is a schematic sectional view along the line I-I' in FIG. 1A.

For instance, FIG. 1A is a schematic plan view of a display substrate, and FIG. 1B is a schematic sectional view along the line I-I' in FIG. 1A.

As shown in FIGS. 1A and 1B, a display area of a display substrate 01 includes a light transmissive display area 1, a peripheral display area 2, and a main display area 3. The peripheral display area 2 at least partially surrounds the light transmissive display area 1, and the main display area 3 at least partially surrounds the light transmissive display area 1 and the peripheral display area 2. As shown in FIG. 1A, the light transmissive display area 1, the peripheral display area 2, and the main display area 3 form a rectangular or approximately rectangular display area as a whole to display a complete (rectangular) image.

As shown in FIG. 1B, the display substrate 01 comprises a display structural layer 510 for implementing the display area and a sensing layer 520. Correspondingly, the display structural layer 510 also includes the light transmissive display area 1 and the peripheral display area 2. The sensing layer 520 is disposed on a non-display side S02 of the display substrate 01 (namely one side away from the user). The sensing layer 520 includes a sensor 521. The sensor 521 and the light transmissive display area 1 are at least partially overlapped in a normal direction F1 of a display surface of the display substrate and is configured to receive and process optical signals that run through the light transmissive display area 1 from a display side S01 of the display substrate 01 (namely one side facing the user). For instance, the sensor 521 is an image sensor, an infrared sensor, a distance sensor, etc. The sensor 521, for instance, can be implemented as a chip, etc.

For instance, the main display area 3 is a main display area (or referred to as a conventional display area) and has higher PPI (Pixel Per Inch) compared with the light transmissive display area 1 and the peripheral display area 2, namely a plurality of subpixels for display with higher density are arranged in the main display area 3. In the main display area 3, each subpixel includes a light-emitting element and a pixel circuit that drives the light-emitting element.

For instance, the light transmissive display area 1 and the peripheral display area 2 also respectively include a plurality of subpixels for display. For instance, the light transmissive display area 1 and the peripheral display area 2 have same resolution.

The light transmissive display area 1 allows light incident from the display side S01 of the display substrate 01 to be transmitted through the display substrate 01 and arrive at the non-display side S02 of the display substrate 01, so as to be used for the normal sensing work of components, such as the sensor 521, disposed on the non-display side S02 of the display substrate 01. However, because the pixel circuit of the subpixel includes structures, such as a plurality of electrodes, lines, and active layers, and is usually light-proof, in order to improve the light transmittance of the light transmissive display area 1, the light-emitting element of the subpixel of the light transmissive display area 1 is separated from the pixel circuit that drives the light-emitting element in physical location.

Figure 2A:
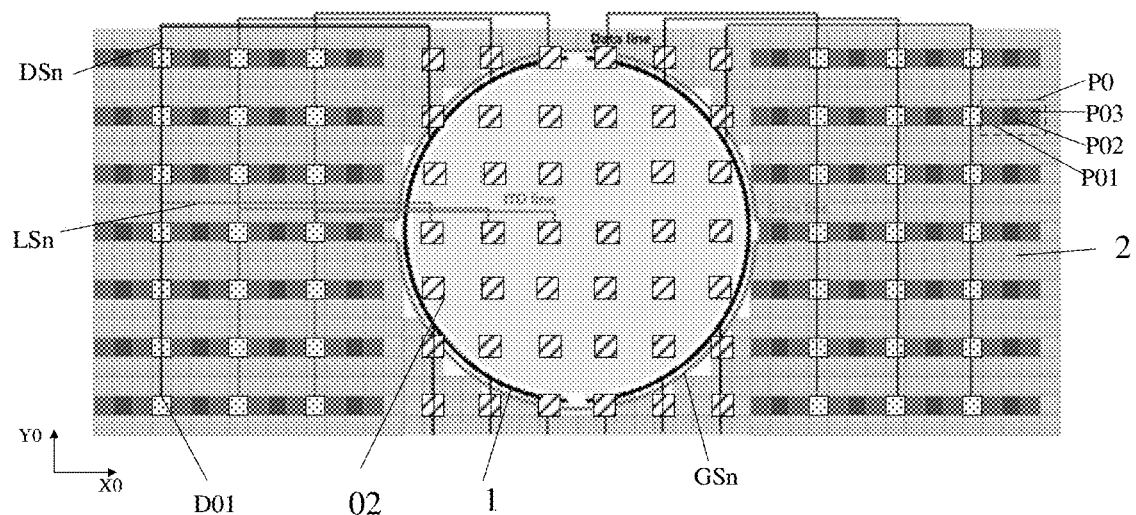
FIG. 2A is a schematic plan view illustrating the line arrangement in the display area of the display substrate as shown in FIG. 1A.
Figure 2B:
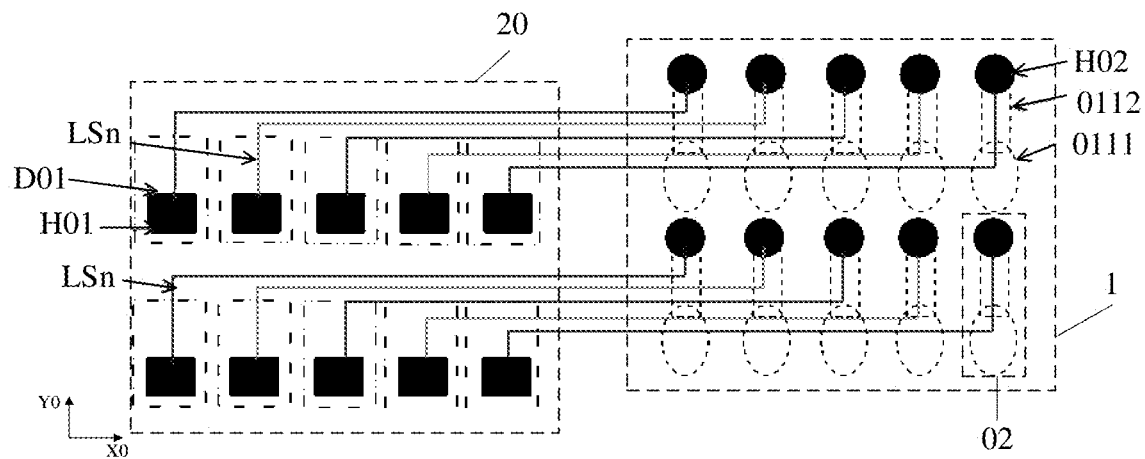
FIG. 2B is another schematic plan view illustrating the line arrangement in the display area of the display substrate as shown in FIG. 1A.

For instance, FIG. 2A is a schematic plan view illustrating the line arrangement in the display area of the display substrate as shown in FIG. 1A, and FIG. 2B is another schematic plan view illustrating the line arrangement in the display area of the display substrate as shown in FIG. 1A.

As shown in FIGS. 2A and 2B, the subpixel of the light transmissive display area 1 includes a light-emitting element 02 disposed in the light transmissive display area 1 and a pixel circuit D01 disposed in the peripheral display area 2. The light-emitting element 02 of the subpixel of the light transmissive display area 1 still retains the predetermined location in the light transmissive display area 1 so as to realize the display function of the light transmissive display area 1, but the pixel circuit D01 that is connected with the light-emitting element 02 and used for driving the light-emitting element 02 is moved out from the light transmissive display area 1 and disposed in the peripheral display area 2. Therefore, these pixel circuits D01 occupy partial space of the peripheral display area 2, and the residual space of the peripheral display area 2 is used for arranging subpixels P0 (for instance, as shown by dotted line boxes in the peripheral display area 2 in FIG. 2A) of the peripheral display area 2, that is, subpixels for realizing the display function in the peripheral display area 2. The subpixels P0 include first subpixels P01, second subpixels P02, and third subpixels P03. For instance, the first subpixels P01 are red subpixels, the second subpixels P02 are green subpixels, and the third subpixels p03 are blue subpixels.

For instance, the pixel circuits D01 of the subpixels P0 of the peripheral display area 2 and the subpixels in the transmissive display area 1 are arranged in an array in the peripheral display area 2. As described above, the subpixels P0 of the peripheral display area 2 and the subpixels in the light transmissive display area 1 have same resolution. For instance, the resolution of the light transmissive display area 1 and the peripheral display area 2 can be set to be lower than the resolution of the main display area 3, that is, the density of the subpixels for display arranged in the light transmissive display area 1 and the peripheral display area 2 is lower than the density of the subpixels of the main display area 3.

For instance, as shown in FIGS. 2A and 2B, the light-emitting elements 02 of the subpixels in the light transmissive display area 1 are electrically connected with the pixel circuits D01 in the peripheral display area 2 in the same row through connection lines LSn, and the connection lines LSn are arranged along the X0 direction, namely the row direction. That is, the connection line LSn connects the pixel circuit D01 in the peripheral display area 2 and the light-emitting element 02 in the light transmissive display area 1 in the same row. For instance, the connection line LSn is at least partially a transparent line to improve the light transmittance of the light transmissive display area 1, and the materials of the connection lines LSn may include transparent conductive materials, such as indium tin oxide (ITO). The connection line LSn can stride over the subpixel P0 of the peripheral display area 2 and electrically connect the light-emitting element 02 of the subpixel disposed in the light transmissive display area 1 and the pixel circuit D01 disposed in the peripheral display area 2 and used for driving the light-emitting element 02.

Moreover, as shown in FIG. 2A, a data line DSn that is used for driving the pixel circuit D01 of each subpixel in the light transmissive display area 1 can be wound at the border of the peripheral display area 2 near the light transmissive display area 1, so as to be electrically connected with the pixel circuit D01 that is moved out from the light transmissive display area 1 and disposed in the peripheral display area 2 to provide data signals required for display. For instance, the data line DSn is wired around the light transmissive display area 1 between the upper side and the lower side of the light transmissive display area 1. The pixel circuits of the subpixels disposed in the same column of the display area (herein including the main display area 3, the peripheral display area 2, and/or the light transmissive display area 1) can be electrically connected with the same data line, so that the subpixels disposed in the same column can be driven by the same data line without changing or adding a data drive circuit. A gate line GSn used for driving the pixel circuit D01 of each subpixel in the light transmissive display area 1 can be wound at the border of the peripheral display area 2 near the light transmissive display area 1 and wired around the light transmissive display area 1 between the left side and the right side of the light transmissive display area 1, so as to be electrically connected with the pixel circuit D01 that is moved out from the light transmissive display area 1 and disposed in the peripheral display area 2 to provide gate scanning signals required for display.

For instance, as shown in FIG. 2B, one end (one end disposed in the peripheral display area 2) of the connection line LSn is connected with the pixel circuit D01 through a pixel circuit through hole H01, and the other end (disposed in the light transmissive display area 1) of the connection line LSn is connected with a first electrode 0111 (for instance, an anode of the light-emitting element 02) of the light-emitting element 02 through an electrode through hole H02. The first electrode 0111 of the light-emitting element 02 is connected with the electrode through hole H02 through a line 0112. The first electrode 0111 and the line 0112 may be integrally formed. That is to say, the first electrode 0111 of the light-emitting element 02 is connected with the connection line LSn through the electrode through hole H02. Because a plurality of connection lines LSn are disposed on the same side of the row provided with the light-emitting elements 02 in the light transmissive display area 1, the plurality of connection lines LSn occupy larger wiring space, so that the electrode through hole H02 and the first electrode 0111 can be farther away from each other (namely the light-emitting elements 02 occupy larger space in the Y0 direction). Thus, it is difficult to improve the arrangement density of the light-emitting elements 02 in the light transmissive display area 1, and it is also difficult to improve the resolution in the light transmissive display area 1.

Figure 1C:
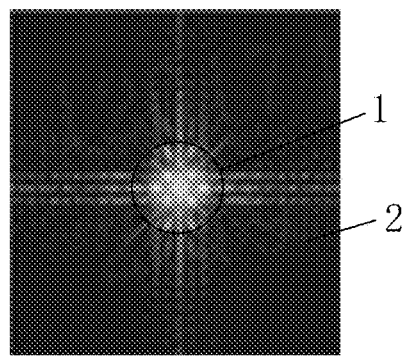
FIG. 1C is a simulated diagram of a display area of a display substrate at the time when the display area of the display substrate is illuminated by a point light source.
Figure 1D:
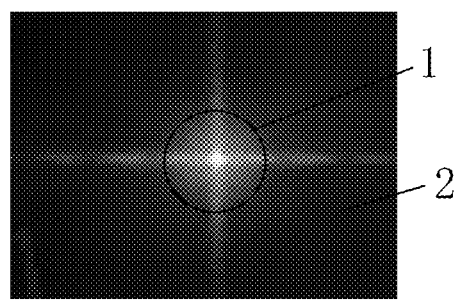
FIG. 1D is another simulated diagram of a display area of a display substrate at the time when the display area of the display substrate is illuminated by the point light source.

For instance, FIG. 1C is a simulated diagram of the display area of the display substrate at the time when the display area of the display substrate is illuminated by a point light source, and FIG. 1D is another simulated diagram of the display area of the display substrate at the time when the display area of the display substrate is illuminated by the point light source. As shown in FIGS. 1C and 1D, in order to test the light transmittance of the light transmissive display area 1 and the peripheral display area 2, the state that the tested light transmissive display area 1 and the tested peripheral display area 2 illuminated by a light source can be simulated. The light source may be a point light source. For instance, the point light source is disposed on one side (for instance, a display side) of the light transmissive display area 1 and the peripheral display area 2. When illuminated by the light source, the effect diagram (as shown in FIG. 1C or 1D) illustrating the display of the light transmissive display area 1 and the peripheral display area 2 shows grating effect, and the grating effect in FIG. 1C is more obvious. The grating effect of the light transmissive display area 1 and the peripheral display area 2 is mainly produced by horizontally and vertically intercrossed lines (for instance, dense connection lines LSn) going through the light transmissive display area 1 and the peripheral display area 2.

Figure 1E:
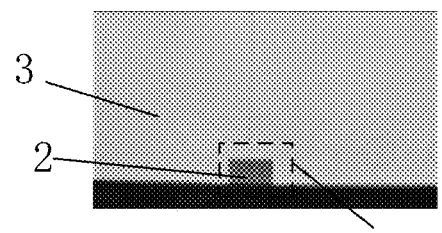
FIG. 1E is a schematic display diagram of the display substrate.
Figure 1F:
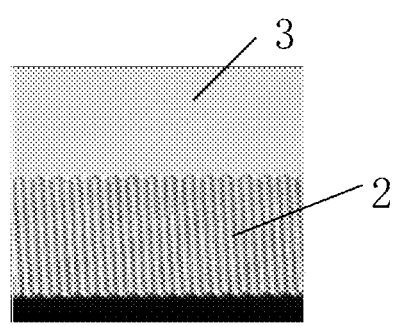
FIG. 1F is an enlarged view of an A0 area in FIG. 1E.

For instance, FIG. 1E is a schematic display diagram of a display substrate, and FIG. 1F is an enlarged view of an A0 area in FIG. 1E. As shown in FIGS. 1F and 1E, the light transmissive display area 1 and the peripheral display area 2 show strong image granular sensation. After the resolution of the light transmissive display area 1 and the peripheral display area 2 is reduced, the brightness is reduced, resulting in strong visual difference (VDIFF) from the main display area 3, thereby causing reduced display effect.

At least one embodiment of the present disclosure provides a display substrate. The display substrate includes a first side for display and a second side opposite to the first side, and the display substrate comprises a base substrate, a plurality of first connection lines, and a plurality of second connection lines. The base substrate comprises a display area which includes a first display area and a second display area that at least partially surrounds the first display area. The first display area includes a first subpixel array and allows light from the first side of the display substrate to be at least partially transmitted to the second side of the display substrate. The first subpixel array includes a plurality of light-emitting elements arranged in an array. The plurality of light-emitting elements include a plurality of first light-emitting elements and a plurality of second light-emitting elements. The second display area includes a first pixel circuit array which includes a plurality of first pixel circuit units. The plurality of first pixel circuit units include a plurality of first pixel circuits and a plurality of second pixel circuits. At least part of the plurality of first connection lines are extended along a first direction and are connected with the plurality of first pixel circuits and the plurality of first light-emitting elements in one-to-one correspondence. The first pixel circuit is configured to drive the first light-emitting element through the first connection line. At least part of the plurality of second connection lines are extended along the first direction and are connected with the plurality of second pixel circuits and the plurality of second light-emitting elements in one-to-one correspondence. The second pixel circuit is configured to drive the second light-emitting element through the second connection line. Each of the plurality of light-emitting elements includes a first electrode. The first electrodes of the plurality of first light-emitting elements and the plurality of second light-emitting elements are arranged in the same row along the first direction. In the first display area, at least part of the plurality of first connection lines are disposed on a first side of the row provided with the first electrodes of the plurality of first light-emitting elements and the plurality of second light-emitting elements in the second direction. At least part of the plurality of first connection lines are disposed on a second side of the row provided with the first electrodes of the plurality of first light-emitting elements and the plurality of second light-emitting elements in the second direction. The second direction is intercrossed with the first direction. The first side and the second side of the row provided with the first electrodes of the plurality of first light-emitting elements and the plurality of second light-emitting elements are opposite to each other in the second direction.

In the display substrate provided by the above embodiment, the first connection lines and the second connection lines along the first direction are respectively disposed on the first side and the second side of the row provided with the first electrodes of the plurality of first light-emitting elements and the plurality of second light-emitting elements, so that the wiring space occupied by the first connection lines and the second connection lines in the second direction is reduced, thereby improving the arrangement density of the light-emitting elements in the first display area and/or increasing the arrangement number in the first direction, improving the resolution of the first display area and/or increasing the dimension (for instance, the PPI) along the first direction, and reducing the grating effect caused by the first connection lines and the second connection lines in the second display area.

Detailed description will be given below with reference to the embodiments of the present disclosure and the examples thereof.

Figure 3A:
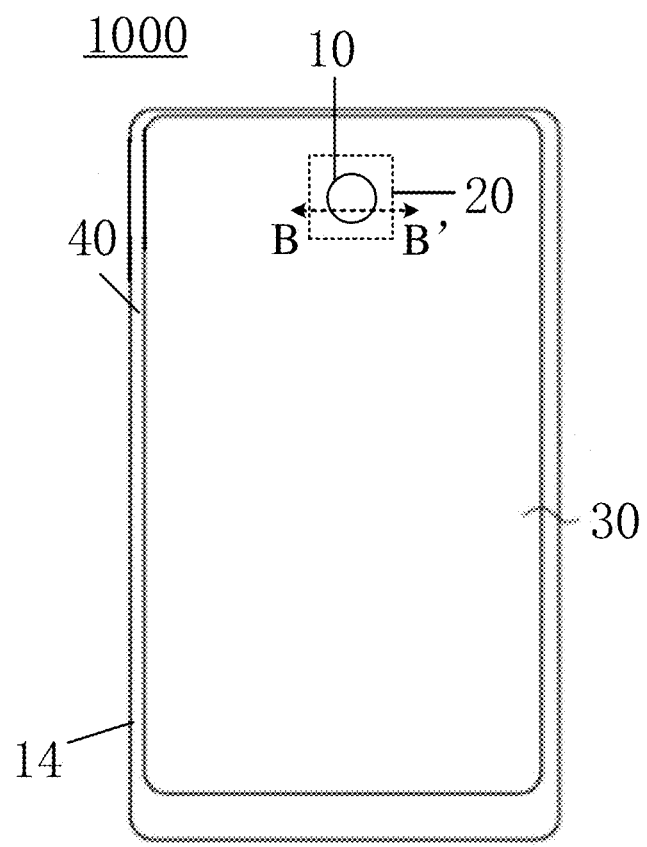
FIG. 3A is a schematic plan view of a display substrate provided by at least one embodiment of the present disclosure.
Figure 3B:
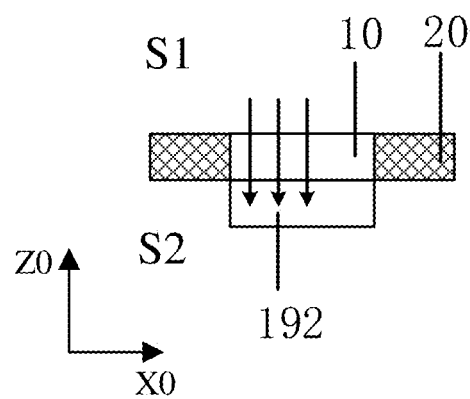
FIG. 3B is a schematic sectional view along the line B-B' in FIG. 3A.

For instance, FIG. 3A is a schematic plan view of a display substrate provided by at least one embodiment of the present disclosure, and FIG. 3B is a schematic sectional view along the line B-B' in FIG. 3A. As shown in FIG. 3A, a display substrate 1000 provided by the embodiment of the present disclosure comprises a base substrate 14. The base substrate 14 includes a display area and a peripheral region 40 surrounds the display area. The display area includes a first display area 10 (for instance, a light transmissive display area), a second display area 20, and a third display area 30 (for instance, a normal display area), which are parallel to each other. The second display area 20 surrounds (for instance, at least partially surrounds) the first display area 10. In FIG. 3A, the first display area 10 is marked by a circle.

For instance, the display substrate provided by the embodiment of the present disclosure may be a display substrate, such as an organic light-emitting diode (OLED) display substrate, or a quantum dot light-emitting diode (QLED). The specific type of the display substrate is not defined in the embodiment of the present disclosure.

For instance, as shown in FIG. 3B, the first display area 10 is a light transmissive display area, namely allowing incident light from a display side S1 (for instance, a first side) of the display substrate 1000 to be transmitted through the area and arrive at a non-display side S2 (for instance, a second side) of the display substrate 1000. A sensor 192 may also be disposed on the non-display side S2 of the display substrate 1000 to receive the transmitted light, so as to realize corresponding function (such as imaging, infrared sensing, distance sensing, etc.). For instance, the sensor 192 is disposed on the non-display side S2 of the display substrate 1000. An orthographic projection of the sensor 192 on the base substrate 14 is at least partially overlapped with the first display area 10. The sensor is configured to receive and process the light from the display side S1 of the display substrate 1000. The light from the display side S1 of the display substrate 1000 may be a collimated light along the normal direction (for instance, the Z0 direction) of the display substrate 1000, or may be a uncollimated light.

For instance, the sensor 192 is an image sensor, an infrared sensor, a distance sensor, etc. The sensor 192, for instance, may be implemented as a chip, etc. The sensor 192 is disposed on the non-display side S2 (a side away from the user) of the display substrate. The sensor 192 is at least partially overlapped with the first display area 10 in the normal direction of the display surface of the display substrate.

For instance, the sensor 192 may be an image sensor and may be used for acquiring an image of an external environment that a light gathering surface of the sensor 192 faces, for instance, the sensor may be a complementary metal oxide semiconductor (CMOS) image sensor or a charge coupled device (CCD) image sensor; or the sensor 192 may be an infrared sensor, a distance sensor, etc. The sensor 192 may be configured to implement a camera of a mobile terminal, such as a mobile phone or a notebook computer, and may further include optical units, such as a lens, a reflecting mirror, or an optical waveguide, as required, so as to modulate an optical path. The type, the function, and the arrangement mode of the sensor 192 are not limited in the embodiment of the present disclosure.

The sensor 192 is disposed on the non-display side S2 of the display panel by double-faced adhesives, etc. An orthographic projection of the sensor 192 on the base substrate 14 is at least partially overlapped with the first display area 10. The sensor is configured to receive the light from the first side S1. In this way, the first display area 10 can realize display and provide convenience for the arrangement of the sensor 192.

Figure 4:
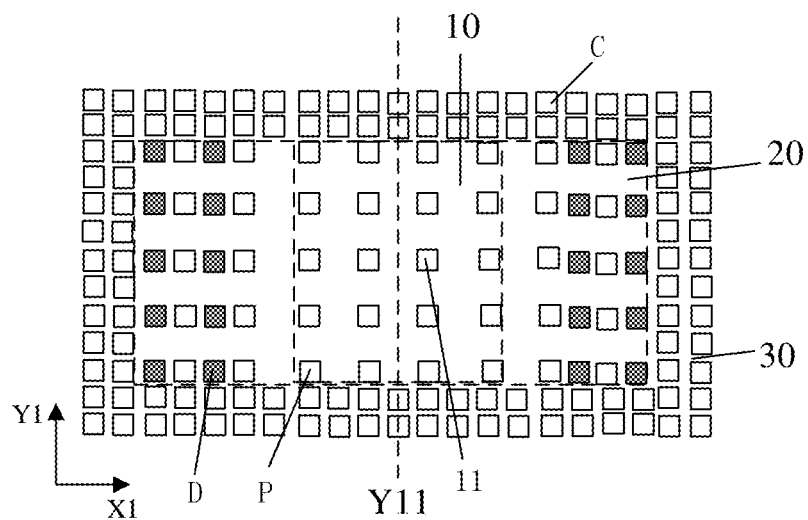
FIG. 4 is a partial enlarged view of the display substrate provided by at least one embodiment of the present disclosure.

For instance, FIG. 4 is a schematic partial enlarged view of the display substrate provided by at least one embodiment of the present disclosure. As shown in FIG. 4, the first display area 10 includes a first subpixel array (formed by white boxes in the first display area 10). The first subpixel array includes a plurality of light-emitting elements 11 (white boxes in the first display area 10) arranged in an array.

The second display area 20 includes a first pixel circuit array (formed by gray boxes in the second display area 20). The first pixel circuit array includes a plurality of first pixel circuit units D (gray boxes in the second display area 20) arranged in an array. The second display area 20 further includes a second subpixel array (formed by white boxes in the second display area 20). The second subpixel array includes a plurality of first pixel units P arranged in an array. The plurality of first pixel units P and the plurality of first pixel circuit units D are alternately arranged.

The third display area 30 at least partially surrounds the second display area 20 and includes a third subpixel array. The third subpixel array includes a plurality of second pixel units C (white boxes in the third display area 30) arranged in an array.

The plurality of first pixel circuit units D are configured to respectively drive the plurality of light-emitting elements 11 in the first display area 10 in one-to-one correspondence. That is to say, the pixel circuits D of the first subpixel array in the first display area 10 are arranged in the second display area 20, and the pixel circuit and the light-emitting element of each subpixel unit are separate from each other in location. Incident light from the display side S1 can be transmitted through white spaces between adjacent light-emitting elements 11 so as to permit the light transmittance of the first display area 10. Each first pixel unit P includes a third light-emitting element and a third pixel circuit which are directly connected with each other, and the third light-emitting element and the third pixel circuit are disposed in the same pixel area and not separate from each other in location. Each second pixel unit C includes a fourth light-emitting element and a fourth pixel circuit which are directly connected with each other, and the fourth light-emitting element and the fourth pixel circuit are disposed in the same pixel area and are not separate from each other in location.

For instance, as shown in FIG. 4, the array of the first pixel units P in the second display area 20 and the array of the plurality of light-emitting elements 11 in the first display area 10 are aligned so as to be distributed in multiple rows and multiple columns (as shown by the arrangement mode in FIG. 4), so as to form a new (complete) array including multiple rows and multiple columns. In this way, the first display area 10 and the second display area 20 have same resolution.

Figure 5:
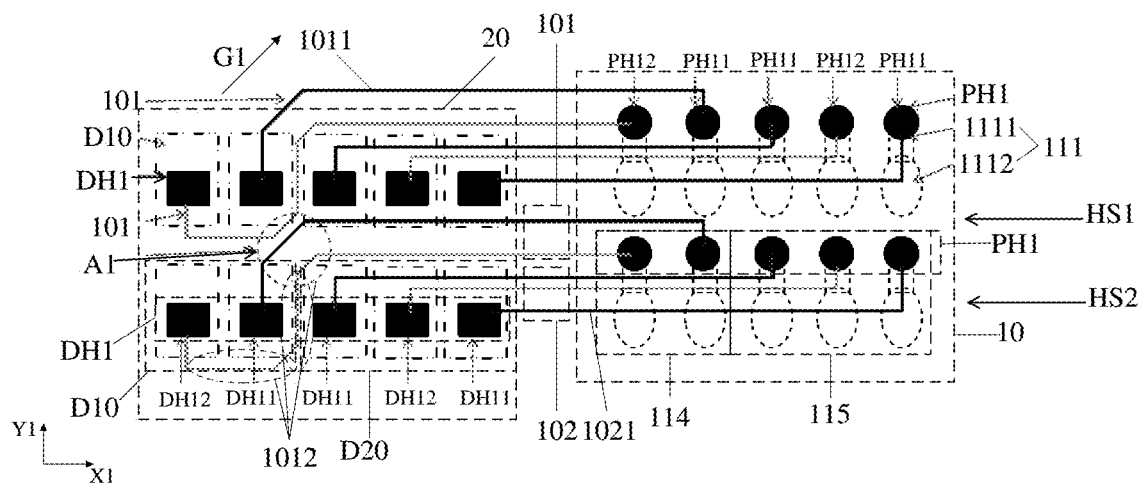
FIG. 5 is a schematic plan view illustrating the line arrangement in a display area of the display substrate provided by at least one embodiment of the present disclosure.

For instance, FIG. 5 is a schematic plan view illustrating the line arrangement in the display area of the display substrate provided by at least one embodiment of the present disclosure. As shown in FIG. 5, the plurality of light-emitting elements 11 in the first display area 10 include first light-emitting elements 114 and second light-emitting elements 115. Correspondingly, the plurality of first pixel circuit units D in the second display area 20 include first pixel circuits D10 and second pixel circuits D20 which are respectively configured to receive driving signals to drive the first light-emitting elements 114 and the second light-emitting elements 115 to emit light. For instance, the first pixel circuits D10, the second pixel circuits D20, the first light-emitting elements 114, and the second light-emitting elements 115 are disposed in one row (for instance, one row in two rows in FIG. 5). In the first display area 10, the first light-emitting element 114 and the first pixel circuit D10 are correspondingly connected with each other in a first direction X1, to form one subpixel in the first display area 10 in function. The second light-emitting element 115 and the second pixel circuit D20 are correspondingly connected with each other in the first direction X1, to form one subpixel in the first display area 10 in function.

It is to be noted that FIG. 5 uses two rows in the first display area 10 and the second display area 20 as an example, and the arrangement way of other rows is the same and not shown in the figure.

For instance, as shown in FIG. 5, the display substrate 1000 further comprises a plurality of first connection lines 101 and a plurality of second connection lines 102. The plurality of first connection lines 101 are extended along the first direction X1 as a whole, and the plurality of second connection lines 102 are also extended along the first direction X1 as a whole. The plurality of first connection lines 101 and the plurality of second connection lines 102 are parallel to each other in the first direction X1, and orthographic projections of the plurality of first connection lines 101 and the plurality of second connection lines 102 on the base substrate are not intercrossed with each other to avoid mutual signal crosstalk. The plurality of first connection lines 101 and the plurality of second connection lines 102 are disposed in the first display area 10 and the second display area 20, namely they are extended and go through the first display area 10 and the second display area 20.

For instance, as shown in FIG. 5, the plurality of first connection lines 101 are electrically connected with the plurality of first pixel circuits D10 and the plurality of first light-emitting elements 114 in one-to-one correspondence, and the first pixel circuit D10 is configured to drive the first light-emitting element 114 to emit light through the first connection line 101. The first connection line 101 electrically connects the first pixel circuit D10 and the first light-emitting element 114 disposed in the same row. The plurality of second connection lines 102 are connected with the plurality of second pixel circuits D20 and the plurality of second light-emitting elements 115 in one-to-one correspondence, and the second pixel circuit D20 is configured to drive the second light-emitting element 115 to emit light through the second connection line 102. The second connection line 102 electrically connects the second pixel circuit D20 and the second light-emitting element 115 disposed in the same row.

For instance, as shown in FIG. 5, each of the plurality of light-emitting elements 11 includes a first electrode 111 (for instance, an anode of the light-emitting element 11). The first electrodes 111 of the plurality of first light-emitting elements 114 and the plurality of second light-emitting elements 115 are arranged in the same row (for instance, one row in two rows in FIG. 5) along the first direction. In the first display area 10, the plurality of first connection lines 101 and the plurality of second connection lines 102 are respectively electrically connected with the plurality of light-emitting elements 114 and the plurality of second light-emitting elements 115 in the same row.

At least part of the plurality of first connection lines 101 are disposed on a first side HS1 of the row provided with the first electrodes 111 of the plurality of first light-emitting elements 114 and the plurality of second light-emitting elements 115 in a second direction Y1, and at least part of the plurality of second connection lines 102 are disposed on a second side HS2 of the row provided with the first electrodes 111 of the plurality of first light-emitting elements 114 and the plurality of second light-emitting elements 115 in the second direction Y1. The first side HS1 and the second side HS2 of the row provided with the first electrodes 111 of the plurality of first light-emitting elements 114 and the plurality of second light-emitting elements 115 are opposite to each other in the second direction Y1. That is to say, the first side HS1 and the second side HS1 respectively indicate the upper side and the lower side of the row provided with the first electrodes 111 of the plurality of first light-emitting elements 114 and the plurality of second light-emitting elements 115.

As shown in the figure, the plurality of first connection lines 101 are extended from the second display area 20 to the first display area 10 from the first side HS1, and the plurality of second connection lines 102 are extended from the second display area 20 to the first display area 10 from the second side HS2. In this way, the utilization rate of the wiring space of the plurality of first connection lines 101 and the plurality of second connection lines 102 in the second direction Y1 is improved, and the arrangement density of the plurality of first light-emitting elements 114 and the plurality of second light-emitting elements 115 is increased. For instance, within the same space range in the second direction Y1, the number of rows of the light-emitting elements is increased, and correspondingly, the number of rows of the first pixel units P in the second display area 20 can also be increased, thereby improving the resolution of the first display area and the second display area, and consequently reducing the difference between the display effect of the first display area and the second display area and the display effect of the third display area.

For instance, in some embodiments, the second direction X1 is intercrossed with the first direction Y1. As shown in FIG. 4, the second direction X1 is, for instance, the horizontal direction (the row direction); the first direction Y1 is, for instance, the vertical direction (the column direction); and the second direction X1 is perpendicular to the first direction Y1. It is to be noted that the second direction X1 and the first direction Y1 may also be intercrossed with each other and not perpendicular to each other. The embodiment as shown in FIG. 5 is only an example. The embodiment of the present disclosure is not limited thereto.

For instance, as shown in FIG. 5, in the second display area 20, the first pixel circuit D10 is disposed on the left side (namely a side away from the first display area 10) of the first display area 10 in the first direction X1. For instance, the first light-emitting element 114 is disposed on the left side (namely a side near the second display area 20) of the first display area 10 in the first direction X1. When the plurality of first connection lines 101 and the plurality of second connection lines 102 are respectively electrically connected with the plurality of first light-emitting elements 114 and the plurality of second light-emitting elements 115 in the same row from the first side HS1 and the second side HS2, respectively, the wiring density between the plurality of first connection lines 101 and the plurality of second connection lines 102 can be improved, and the first connection lines and the second connection lines are not overlapped with each other.

For instance, as shown in FIG. 4, the light-emitting elements 11 of the first display area 10 may be divided into left light-emitting elements 11 and right light-emitting elements 11 from a center line Y11 of the first display area 10. The left light-emitting elements 11 may be connected with the first pixel circuit units D in partial second display area 20 disposed on the left side of the first display area 10 by the connection way as shown in FIG. 5. The right light-emitting elements 11 are connected with the first pixel circuit units D in partial second display area 20 disposed on the right side of the first display area 10 by the connection way as shown in FIG. 5. That is to say, the structure of the right light-emitting elements 11 and the partial second display area 20 on the right side and the structure of the left light-emitting elements 11 and the partial second display area on the left side may be symmetrical to each other relative to the center line Y11.

For instance, as shown in FIG. 5, when the second connection lines 102 are electrically connected with the second light-emitting elements 115 in the same row from the second side HS2, in the first display area 10, orthographic projections of the second connection lines 102 on the base substrate 14 are overlapped with the first electrodes 111 of the plurality of second light-emitting elements 115 through which the second connection lines pass. When the first connection lines 102 are electrically connected with the second light-emitting elements 115 in the same row from the first side HS2, in the first display area 10, orthographic projections of the first connection lines 102 on the base substrate 14 are not overlapped with the first electrodes 111 of the first light-emitting elements 114 and the second light-emitting elements 115. In this way, the number of the connection lines connected with the light-emitting elements 111 is reduced, and then the light transmittance of the first display area is improved.

For instance, the first connection lines 101 and the second connection lines 102 (for instance, at least part in the first display area 10) are transparent conductive lines. In this way, the first connection lines 101 and the second connection lines 102 have higher light transmittance, and then the first display area 10 can have higher light transmittance.

For instance, the materials of the first connection lines 101 and the second connection lines 102 may include transparent conductive materials, for instance, transparent metal oxides, such as ITO and indium zinc oxide (IZO), and the materials of metal line layers may include metal materials, such as silver (Ag), aluminum (Al), molybdenum (Mo), or titanium (Ti), or alloy materials thereof.

For instance, as shown in FIG. 4, the array arrangement density of the plurality of second pixel units C is greater than the array arrangement density of the plurality of first pixel units P in the second display area 20, and is also greater than the array arrangement density of the plurality of light-emitting elements 11 in the first display area 10, so that the display resolution of the third display area 30 can be higher than the display resolution of the second display area 20 and the first display area 10.

For instance, as shown in FIG. 4, the array arrangement density of the light-emitting elements 11 in the first display area 10 is the same as the array arrangement density of the first pixel units P in the second display area, and the first pixel circuit array is alternately arranged at the gap after the array arrangement of the first pixel units P in the second display area 20 and is configured to be electrically connected with the array of the light-emitting elements 11 in the first direction Y1 and the second direction X1 respectively to drive the light-emitting elements 11 to emit light.

For instance, each of the plurality of first connection lines includes a first main part and at least one first bending part. As shown in FIG. 5, each of the plurality of first connection lines 101 includes a first main part 1011 and a first bending part 1012.

The first main part 1011 is disposed in the first display area 10 and the second display area 20 and are extended along the first direction X1. In the first display area 10, the main part 1011 is disposed on the first side HS1 of the row provided with the first electrodes 111 of the plurality of first light-emitting elements 114 and the plurality of second light-emitting elements 115. In the second display area 20, the first main part 1011 is disposed on the first side HS1 of the row provided with the first pixel circuits D10. It is to be noted that, because the first pixel circuits D10 and the light-emitting elements 11 are disposed in the same row, the above row provided with the first electrodes 111 of the plurality of first light-emitting elements 114 and the plurality of second light-emitting elements 115 and the above row provided with the first pixel circuits D10 refer to the same row, and the first side HS1 also refers to the same side, namely the side away from the first electrodes 111 of the light-emitting elements 11. In addition, the second side HS2 described in the embodiment also refers to a side near the first electrodes 111 of the light-emitting elements 11. The first main parts 1011 are connected with the first electrodes 111 of the plurality of first light-emitting elements 114 in one-to-one correspondence to provide light-emitting driving current.

The first bending part 1012 is disposed in the second display area 20 and is connected with the first pixel circuit D10 and the first main part 1011. The first bending part 1012 is extended to the first side HS1 of the first pixel circuit D10 from the first pixel circuit D10. That is to say, the plurality of first connection lines 101 is bent at first when they are led out from the first pixel circuits D10 and then are routed along the first direction X1.

For instance, the first connection line 101 connected with the first pixel circuit D10 in the first column (the leftmost) as shown in the figure is led out from the second side HS2 of the first pixel circuit D10 at first and then extended to the first side HS1 of the first pixel circuit D10. The first connection line 101 may include two chamfer angle parts, a section of line extended along the first direction X1, and a section of line extended along the second direction Y1.

For instance, the first connection line 101 connected with the first pixel circuit D10 in the second column (the last but one from the left side) as shown in the figure is led out from the first side HS1 of the first pixel circuit D10 and is extended towards the direction away from the first pixel circuit D10 at first and then connected with the main part 1011. The first connection line 101 may include a chamfer angle part. The first bending parts 1012 may allow the first main parts 1011 to be away from the first electrodes of the plurality of first light-emitting elements 114 in the first display area 10, so as to improve the utilization rate of the wiring space.

For instance, the second side HS2 and the first side HS1 of the first pixel circuit D10 are opposite to each other in the second direction Y1.

For instance, in other embodiments, when the connection lines are not overlapped with each other, the first bending part 1012 may also have a part to be curved line. For instance, the chamfer angle part is an arc.

For instance, at least part of at least one first bending part is extended towards the first side of the first pixel circuit along a third direction. As shown in FIG. 5, at least part of the first bending part 1012 is extended towards the first side HS1 of the first pixel circuit D10 along a third direction G1. For instance, two chamfer angle parts of the first connection line 101 connected with the first pixel circuit D10 in the first column (the leftmost) as shown in the figure are extended along the third direction G1. One chamfer angle part of the first connection line 101 connected with the first pixel circuit D10 in the second column (the last but one from the left side) as shown in the figure is extended along the third direction G1. The third direction G1 is intercrossed with the first direction X1 and the second direction Y1, namely the third direction G1 is different from the first direction X1 and the second direction Y1.

For instance, as shown in FIG. 5, the first bending part 1012 in the first row and the first bending part 1012 in the second row in the figure are not intercrossed with each other in the case of wiring. For instance, the chamfer angle part disposed on the second side HS2 of the first connection line 101 connected with the first pixel circuit D10 in the first row and the first column (the leftmost) as shown in the figure is parallel to one chamfer angle part of the first connection line 101 connected with the first pixel circuit D10 in the second row and the second column (the left but one from the left side) as shown in the figure. In this way, the spacing between different connection lines is increased to avoid signal cross-talk.

For instance, at least one first bending part of at least one of the plurality of first connection lines includes a first bending sub-part.

Figure 6:
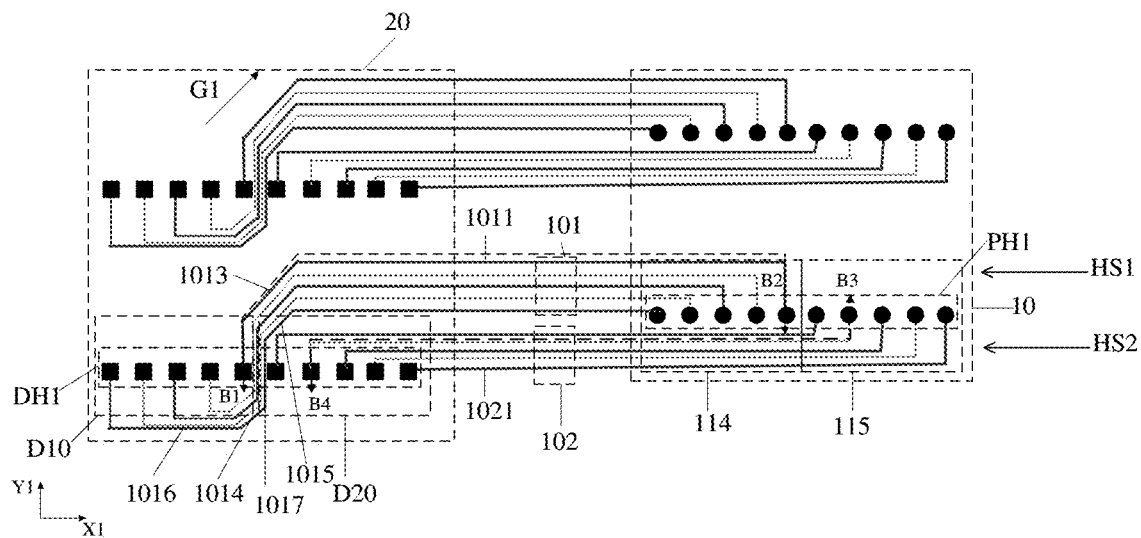
FIG. 6 is a schematic plan view illustrating the line arrangement in a display area of a display substrate provided by at least another embodiment of the present disclosure.

FIG. 6 is a schematic plan view illustrating the line arrangement in a display area of the display substrate provided by at least another embodiment of the present disclosure. As shown in FIG. 6, the first bending part 1012 of the first connection line 101 includes a first bending sub-part 1013 (for instance, a chamfer angle part). The first bending sub-part 1013 is disposed on the first side HS1 of the first pixel circuit D10 (for instance, the first pixel circuit D10 disposed in the fifth column from the left side in FIG. 6) and is extended along the third direction G1. The first bending sub-part 1013 is connected with the first pixel circuit D10 and the first main part 1011. The first pixel circuit D10 connected with the first bending sub-part 1013 is adjacent to the second pixel circuit D20. That is to say, the first pixel circuit D10 connected with the first bending sub-part 1013 is the first pixel circuit D10 closest to the second pixel circuit D20. The first connection line 101 including the first bending sub-part 1013 is closest to the connection line in the previous row. That is to say, in the second direction Y1, other connection lines are all arranged below the first connection line 101 including the first bending sub-part 1013. The above arrangement way can utilize the wiring space of the display substrate as much as possible while enable the connection lines not to be intercrossed with each other.

For instance, at least one first bending part of at least one of the plurality of first connection lines is extended to the first side of the first pixel circuit from the second side of the first pixel circuit, and includes a second bending sub-part, a third bending sub-part, a first connection sub-part, and a second connection sub-part.

As shown in FIG. 6, the first bending part 1012 of the first connection line 101 is extended to the first side HS1 of the first pixel circuit D10 from the second side HS2 of the first pixel circuit D10. For instance, the first connection line 101 is a connection line connected with the first pixel circuits D10 on the first four columns from the left side in FIG. 6. The first connection line 101 includes a second bending sub-part 1014 (for instance, a chamfer angle part), a third bending sub-part 1015 (for instance, a chamfer angle part), a first connection sub-part 1016, and a second connection sub-part 1017. The first connection sub-part 1016 and the second bending sub-part 1014 are disposed on the second side DH10 of the first pixel circuit; the second bending sub-part 1014 is extended along the third direction G1; and the first connection sub-part 1016 is extended along the first direction X1 and connected with the first pixel circuit DH10 and the second bending sub-part 1014. The second connection sub-part 1017 is extended along the second direction Y1 and disposed between the first pixel circuit D10 (connected with the first connection line 101 including the first bending sub-part 1013) and the second subpixel circuit D20 which are adjacent to each other, and The second connection sub-part 1017 is connected with the second bending sub-part 1014 and the third bending sub-part 1015. The third bending sub-part 1015 is disposed on the first side HS1 of the first pixel circuit D10, the third bending sub-part 1015 is extended along the third direction G1 and is connected with the first main part 1011 of the first connection line 101, so that the first main part 1011 of the first connection line 101 can be disposed on the first side HS1 of the first light-emitting element 114 in the first display area.

For instance, as shown in FIG. 6, the first connection line 101 connected with the first pixel circuits D10 in the first four columns from the left side in FIG. 6 is disposed on a side of the first connection line 101 connected with the first pixel circuit D10 in the fifth column from the left side in FIG. 6 near the first pixel circuit D10, and is respectively connected with the first light-emitting elements 114 in the first to fourth columns from the left side in the first display area. The first connection line 101 connected with the first pixel circuit D10 in the fifth column from the left side in FIG. 6 is also connected with the first light-emitting element 114 in the fifth column in the first display area.

For instance, in other embodiments, all the first connection lines 101 adopt the same wiring way as the first connection line 101 connected with the first pixel circuits D10 in the first fourth columns from the left side in FIG. 6. That is to say, the first connection line 101 (for instance, connected with the first pixel circuit D10 in the fifth column from the left side in FIG. 6) including the first bending sub-part 1013 is not arranged. In the deformed embodiment, the second connection sub-part 1017 of the first connection line 101 connected with the first pixel circuits D10 in the first four columns from the left side in FIG. 6 may run through the first pixel circuits D10 in the fourth column and the fifth column from the left side in FIG. 6; the first connection line 101 connected with the first pixel circuit D10 in the fifth column from the left side in FIG. 6 is also connected with the first light-emitting element 114 on the leftmost (the first column) in the first display area; and the first connection line 101 connected with the first pixel circuits D10 in the first four columns from the left side in FIG. 6 is disposed on a side of the first connection line 101 connected with the first pixel circuit D10 in the fifth column from the left side in FIG. 6 away from the first pixel circuit D10, and is respectively connected with the first light-emitting elements 114 in the second to fifth columns from the left side in the first display area.

For instance, as shown in FIGS. 5 and 6, each of the plurality of second connection lines 102 includes a second main part 1021. The second main part 1021 is extended along the first direction X1 and disposed on the second side HS2 of the row provided with the first electrodes 111 of the plurality of first light-emitting elements 114 and the plurality of second light-emitting elements 115. The second main part 1021 is connected with the first electrode 111 of the second light-emitting element 115 and the second pixel circuit D20. The second main part 1021 is disposed on a side of the first main part 1011 near the first electrodes 111 of the plurality of first light-emitting elements 114 and the plurality of second light-emitting elements 115. In the first display area 10, an orthographic projection of the main part 1021 of the second connection line 102 on the base substrate is overlapped with orthographic projections of the first electrodes 111 of the plurality of second light-emitting elements 114 and the plurality of first light-emitting elements 115 on the base substrate. In this way, the utilization rate of the wiring space is increased and the resolution of the first display area and the second display area are improved.

For instance, as shown in FIG. 6, the first main parts 1011 of the plurality of first connection lines 101 are parallel to the second main parts 1021 of the plurality of second connection lines 102 in the first direction X1. In this way, the utilization rate of the wiring space and the resolution of the first display area and the second display area are improved.

Figure 9A:
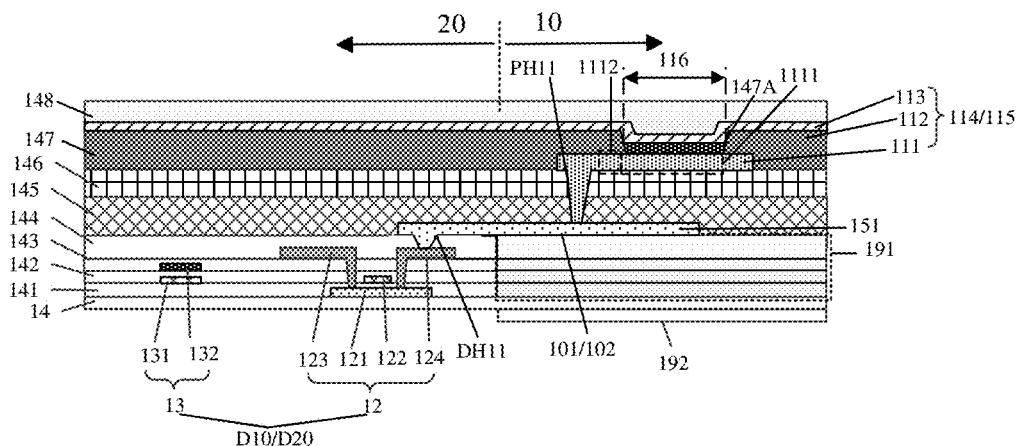
FIG. 9A is a schematic sectional view along the line B1-B2 in FIG. 6.
Figure 9B:
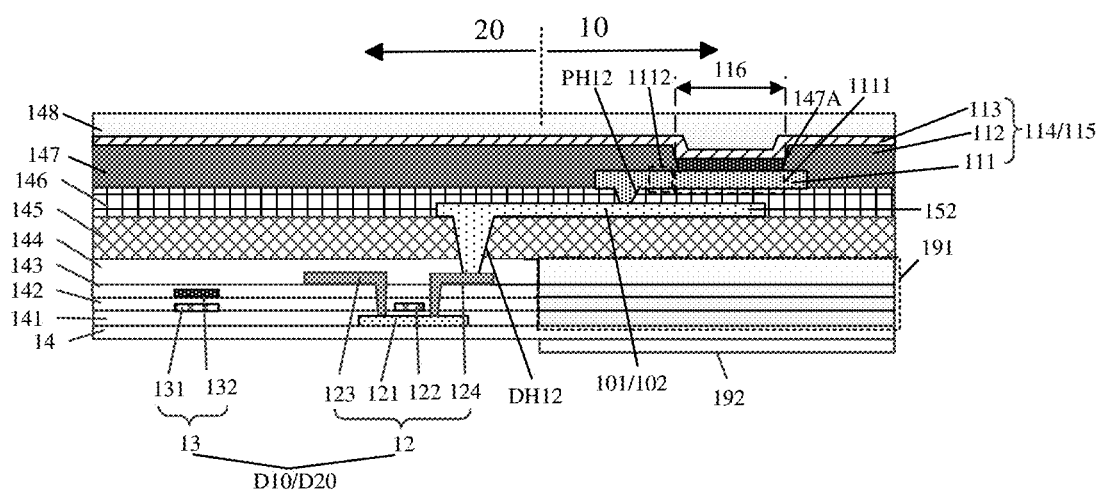
FIG. 9B is a schematic sectional view along the line B3-B4 in FIG. 6.

For instance, FIG. 9A is a schematic sectional view along the B1-B2 line in FIG. 6, and FIG. 9B is a schematic sectional view along the B3-B4 line in FIG. 6. The B1-B2 line in FIG. 6 runs through a dark-colored first connection line 101 (or a dark-colored second connection line 102), and the B3-B4 line in FIG. 6 runs through a light-colored first connection line 101 (or a light-colored second connection line 102). For instance, the B1-B2 line and the B3-B4 line in FIG. 6 may be two adjacent lines that run through the first connection lines 101 or two adjacent lines that run through the second connection lines 102. As shown in FIGS. 9A and 9B, the display substrate 1000 further comprises a first insulating layer (namely a first planarization layer 144), a second insulating layer (namely a second planarization layer 145), a third insulating layer (namely a third planarization layer 146), a first transparent line layer 151, and a second transparent line layer 152.

For instance, as shown in FIGS. 9A and 9B, the first planarization layer 144 is disposed on a side of the first pixel circuit D10 or the second pixel circuit D20 away from the base substrate 14 to provide a planarization surface; the second planarization layer 145 is disposed on a side of the first planarization layer 144 away from the base substrate 14 to provide a planarization surface; the third planarization layer 146 is disposed on a side of the second planarization layer 145 away from the base substrate 14 to provide a planarization surface; and the first transparent line layer 151 is disposed between the first planarization layer 144 and the second planarization layer 145 (as shown in FIG. 9A). The second transparent line layer 152 is disposed on a side of the second planarization layer 145 away from the base substrate 14 (as shown in FIG. 9B). The first light-emitting elements 114 or the second light-emitting elements 115 are disposed on a side of the third planarization layer 146 away from the base substrate 14. The first electrodes 111 of the first light-emitting elements 114 or the second light-emitting elements 115 are disposed on a side of the third planarization layer 146 away from the base substrate 14.

For instance, the materials of the first transparent line layer 151 and the second transparent line layer 152 may include transparent conductive materials, for instance, transparent metal oxides, such as ITO, or IZO, and the materials of the metal line layers may include metal materials, such as silver (Ag), aluminum (Al), molybdenum (Mo), or titanium (Ti) or alloy materials thereof.

For instance, the materials of the first planarization layer 144, the second planarization layer 145, and the third planarization layer 146 include inorganic insulating materials, such as silicon oxide, silicon nitride, and silicon oxynitride, and may also include organic insulating materials, such as polyimide, poly(phthalimide), poly (phthalamide), acrylic resin, benzocyclobutene (BCB), or phenolic resin, which are not limited in the embodiment of the present disclosure.

For instance, as shown in FIGS. 6 and 9A, the first transparent line layer 151 includes one of two adjacent connection lines of the plurality of first connection lines 101 and one of two adjacent connection lines of the plurality of second connection lines 102. That is to say, the first transparent line layer 151 includes a dark-colored first connection line 101 and a dark-colored second connection line 102 in FIG. 6.

For instance, as shown in FIGS. 6 and 9B, the second transparent line layer 152 includes the other one of the two adjacent first connection lines 101 and the other one of the two adjacent second connection lines of the plurality of second connection lines 102. That is to say, the second transparent line layer 152 includes a light-colored first connection line 101 and a light-colored second connection line 102 in FIG. 6. The dark-colored first connection line 101 and the light-colored first connection line 101 in the first connection lines 101 are spaced from each other and respectively disposed in different film layers to reduce signal crosstalk. The dark-colored second connection line 102 and the light-colored second connection line 102 in the second connection lines 102 are spaced from each other and respectively disposed in different film layers to reduce signal crosstalk.

As shown in FIGS. 5, 9A and 9B, the display substrate 1000 further comprises a plurality of pixel circuit connecting holes DH1. The plurality of pixel circuit connecting holes DH1 are disposed in the second display area 20 and include a plurality of first pixel circuit connecting holes DH11 and a plurality of second pixel circuit connecting hole DH12. As shown in FIG. 9A, the first pixel circuit connecting hole DH11 runs through the first planarization layer 144. The first connection line 101 and the second connection line 102 disposed in the first transparent line layer 151 are respectively electrically connected with the first pixel circuit D10 or the second pixel circuit D20 through the first pixel circuit connecting hole DH11. As shown in FIG. 9B, the second pixel circuit connecting hole DH12 runs through the first planarization layer 144 and the second planarization layer 145, and the first connection line 101 and the second connection line 102 disposed in the second transparent line layer 152 are respectively electrically connected with the first pixel circuit D10 and the second pixel circuit D20 through the second pixel circuit connecting hole DH12.

Figure 7:
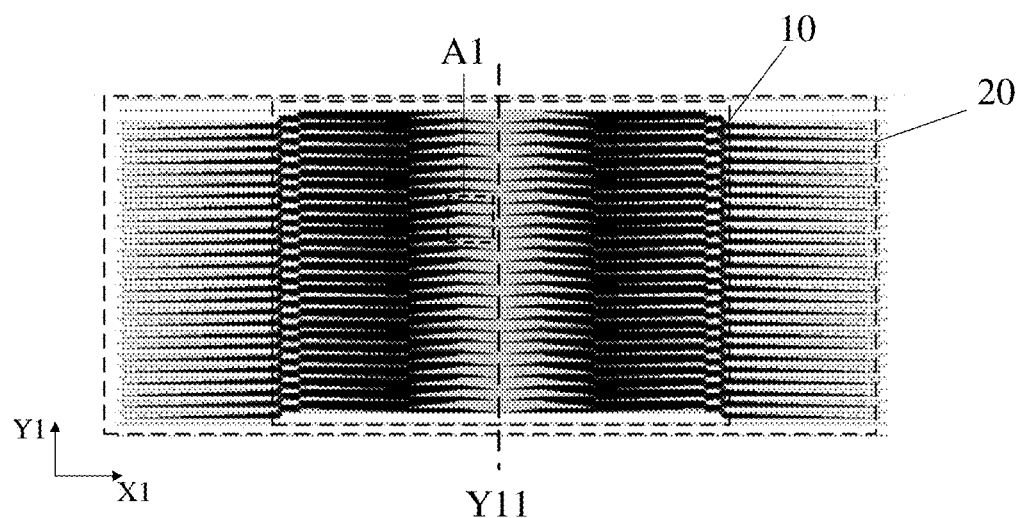
FIG. 7 is a schematic partial view of the display substrate provided by at least one embodiment of the present disclosure.

For instance, FIG. 7 is a schematic partial view of the display substrate provided by at least one embodiment of the present disclosure. FIG. 7 shows the line arrangement of the first display area 10 and the second display area 20. The wiring layout is symmetry relative to the center line Y11. An A1 area in FIG. 7 is one part in the first display area 10.

Figure 8A:
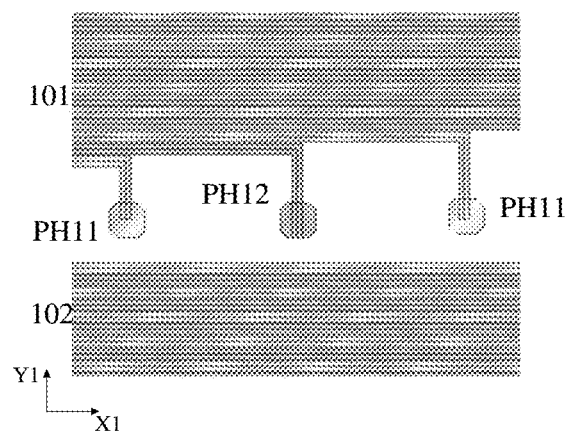
FIG. 8A is an enlarged view of an A1 area in FIG. 7 provided by at least one embodiment of the present disclosure.
Figure 8B:
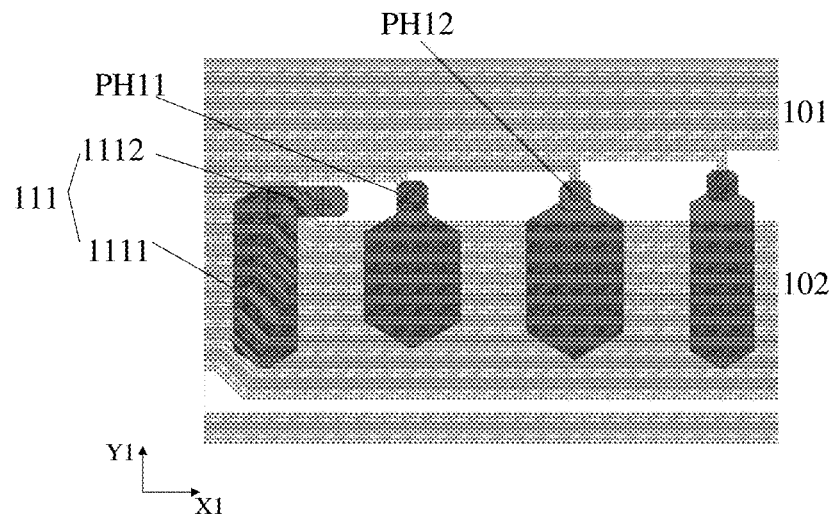
FIG. 8B is an enlarged view of an A1 area in FIG. 7 provided by at least another embodiment of the present disclosure.
Figure 8C:
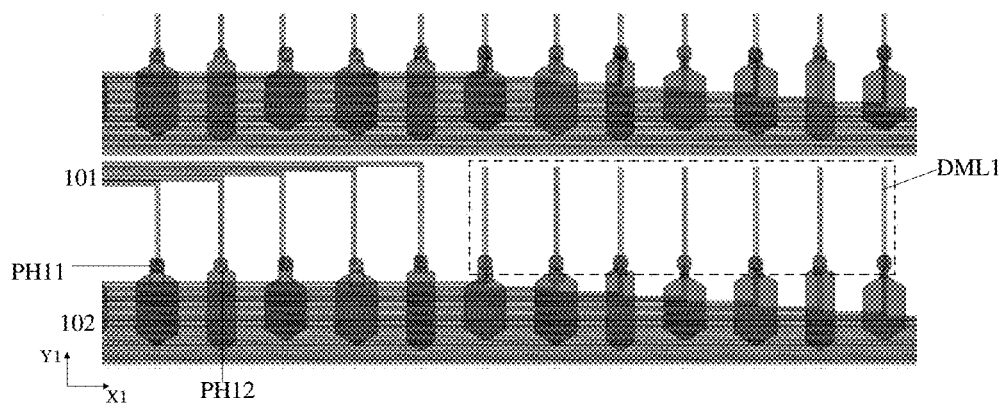
FIG. 8C is an enlarged view of an A1 area in FIG. 7 provided by at least still another embodiment of the present disclosure.

FIG. 8A is an enlarged view of the A1 area in FIG. 7 provided by at least one embodiment of the present disclosure; FIG. 8B is an enlarged view of the A1 area in FIG. 7 provided by at least another embodiment of the present disclosure; and FIG. 8C is an enlarged view of the A1 area in FIG. 7 provided by at least still another embodiment of the present disclosure.

For instance, as shown in FIGS. 5 and 8A, the display substrate 1000 further comprises a plurality of electrode connecting holes PH1. The plurality of electrode connecting holes PH1 are disposed in the first display area 10 and disposed on the first side HS1 of the row provided with the first electrodes 111 of the plurality of first light-emitting elements 114 and the plurality of second light-emitting elements 115, and include a plurality of first electrode connecting holes PH11 and a plurality of second electrode connecting holes PH12.

For instance, as shown in FIG. 9A, the first electrode connecting hole PH11 runs through the second planarization layer 144 and the third planarization layer 145, and the first connection lines 101 or the second connection lines 102 disposed in the first transparent line layer 151 are respectively electrically connected with the first electrodes 111 of the first light-emitting elements 114 or the second light-emitting elements 115 through the first electrode connecting hole PH11.

For instance, as shown in FIG. 9B, the second electrode connecting hole PH12 runs through the third planarization layer 145, and the first connection lines 101 and the second connection lines 102 disposed in the second transparent line layer 152 are respectively electrically connected with the first electrodes 111 of the first light-emitting elements 114 or the second light-emitting elements 115 through the second electrode connecting hole PH12.

For instance, as shown in FIG. 8C, the display substrate 1000 further comprises first virtual lines DML1 disposed in the first display area 10. The first virtual lines DML1 are disposed between the first electrodes 111 of the plurality of first light-emitting elements 114 and the plurality of second light-emitting elements 115 in adjacent rows and extended along the second direction Y1. That is to say, the first virtual line DML1 is disposed between two rows in FIG. 8C. The first virtual line DML1 is connected with one end of the electrode connecting hole PH1 connected with the second connection line 102. That is to say, the first virtual line DML1 may be regarded as part of the second connection line 102 extended to the first side HS1 from the electrode connecting hole PH1. The first virtual line DML1 is extended towards the direction away from the first electrodes 111 of the second light-emitting elements 115 from the electrode connecting hole PH1. An orthographic projection of the first virtual line DML1 on the base substrate 14 is not overlapped with the first connection lines 101 and the second connection lines 102. When the second connection line 102 is connected with the first electrode 111 of the second light-emitting element 115 through the electrode connecting hole PH1, the second connection line 102 runs through the first electrode 111 of the second light-emitting element 115, so that no line is arranged on a side of the electrode connecting hole PH1 away from the first electrode 111 of the second light-emitting element 115, and correspondingly, no line is arranged on a side of the first connection line in this area away from the first electrode 111 of the first light-emitting element 114. In order to realize uniform wiring and uniform light transmittance, the first virtual lines DML1 are arranged.

For instance, as shown in FIGS. 9A and 9B, the display substrate 1000 further comprises a pixel define layer (PDL) 147. The PDL 147 is disposed on a side of the first electrodes 111 of the plurality of light-emitting elements 11 (the first light-emitting elements 114 or the second light-emitting elements 115) away from the base substrate 14, and the PDL 147 includes a plurality of first pixel openings 147A. The plurality of first pixel openings 147A are in one-to-one correspondence with the plurality of light-emitting elements 11 (the first light-emitting elements 114 or the second light-emitting elements 115) to form light-emitting areas 116 of the plurality of light-emitting elements (the first light-emitting elements 114 or the second light-emitting elements 115). Each of the plurality of light-emitting elements 11 further includes a first light-emitting layer 112 and a second electrode 113 (for instance, a cathode). The second electrode 113 is disposed on a side of the PDL 147 away from the base substrate 14. The light-emitting layer 112 is arranged in the first pixel openings 147A and disposed between the first electrode 111 and the second electrode 112. A part of the light-emitting layer 112 directly clamped between the first electrode 111 and the second electrode 112 will emit light after electrified, so an area occupied by this part corresponds to the above light-emitting area 116.

For instance, the materials of the PDL 147 may include organic insulating materials, such as polyimide, poly(phthalimide), poly (phthalamide), acrylic resin, benzocyclobutene (BCB), or phenolic resin, or include inorganic insulating materials, such as silicon oxide or silicon nitride, which are not limited in the embodiment of the present disclosure.

For instance, the materials of the first electrodes 111 may include at least one transparent conductive oxide material, such as ITO, IZO, or zinc oxide (ZnO). In addition, the first electrode 111 may include metal with high reflectivity, such as silver (Ag), as a reflecting layer.

For instance, for an OLED, the first light-emitting layer 112 may include small molecule organic materials or polymer molecule organic materials, it may be a fluorescent luminescent material or a phosphorescent luminescent material, and it may emit red light, green light, and blue light, or it may emit white light. Moreover, the light-emitting layer may further include function layers, such as an electron injection layer (EIL), an electron transport layer (ETL), a hole injection layer (HIL), and a hole transport layer (HTL), as required. For a QLED, the light-emitting layer may include quantum dot materials, such as silicon quantum dots, germanium quantum dots, cadmium sulfide quantum points, cadmium selenide quantum dots, cadmium telluride quantum dots, zinc selenide quantum dots, lead sulfide quantum dots, lead selenide quantum dots, indium phosphide quantum dots, and indium arsenide quantum dots. The particle size of the quantum dots is 2-20 nm.

For instance, the second electrode 113 may include a great variety of conductive materials. For instance, the second electrode 113 may include metal materials, such as lithium (Li), aluminum (Al), magnesium (Mg), or silver (Ag).

For instance, as shown in FIGS. 5, 8B, 9A, and 9B, the first electrodes 111 of at least part of the plurality of light-emitting elements 11 (the first light-emitting elements 114 or the second light-emitting elements 115) include first electrode main parts 1111 and first electrode connection parts 1112. The first electrode main part 1111 is disposed in the light-emitting area 116 of the light-emitting element 11 (the first light-emitting element 114 or the second light-emitting element 115). The first electrode connection part 1112 is connected with the electrode connecting hole PH1 (the first electrode connecting hole PH11 or the second electrode connecting hole PH12) and the first electrode main part 1111. In addition, for instance, the first electrodes 111 of at least part of the plurality of light-emitting elements 11 (the first light-emitting elements 114 or the second light-emitting elements 115) only include the first electrode main parts 1111 which are directly electrically connected with the electrode connecting holes PH1, so as to reduce the resistance between transistors and the light-emitting areas. Because the first connection line 101 and the second connection line 102 are disposed on two sides of the light-emitting element 11, the arrangement density of the first electrodes 111 of the light-emitting elements 11 is improved, and the length of the first electrode connection parts 1112 in the second direction Y2 is decreased, so as to improve the light transmittance of the first display area 10.

Figure 10A:
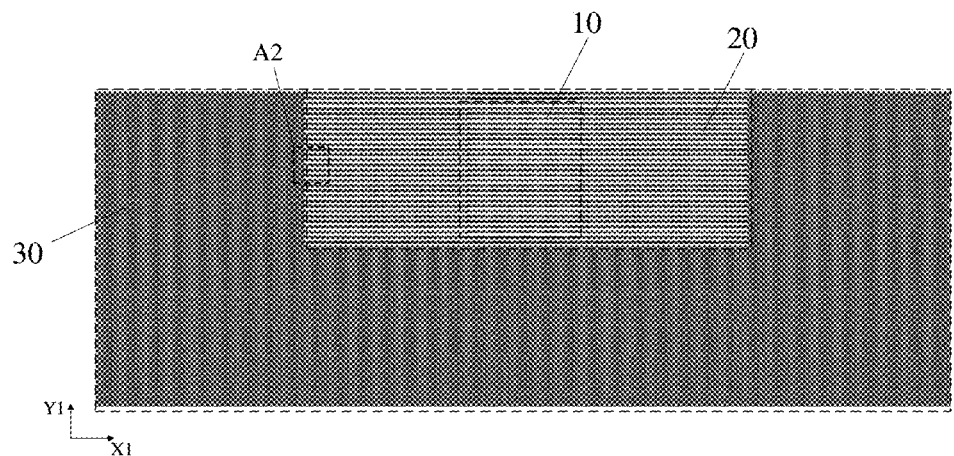
FIG. 10A is a schematic plan view of the display area of the display substrate provided by at least one embodiment of the present disclosure.
Figure 10B:
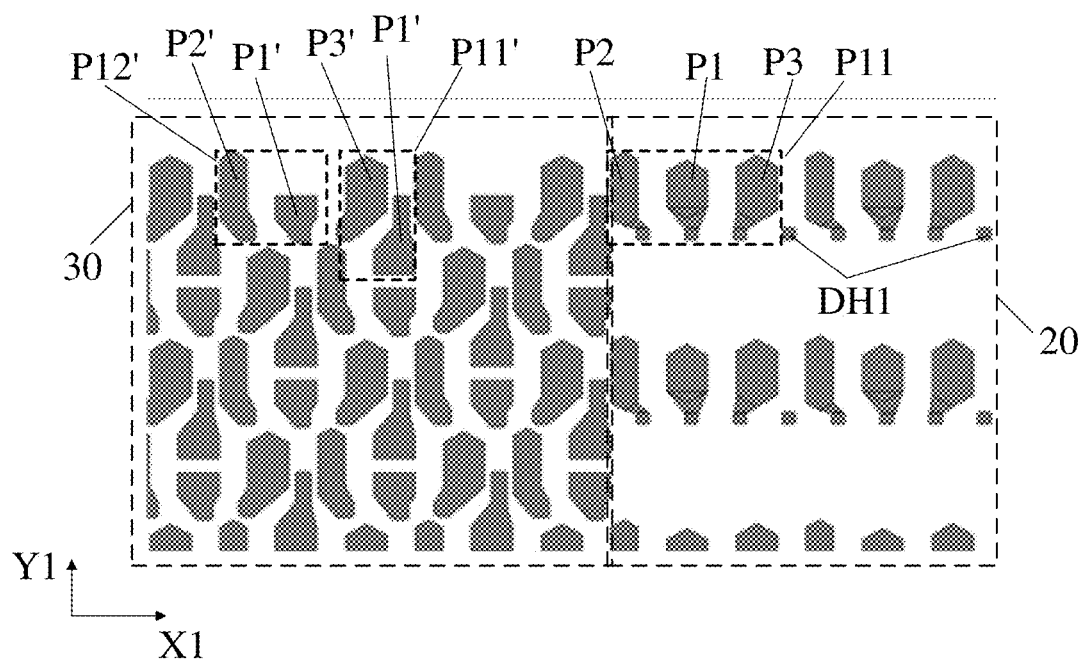
FIG. 10B is an enlarged view of an A2 area in FIG. 10A provided by at least one embodiment of the present disclosure.

For instance, as shown in FIG. 8B, the shapes of the first electrode main parts 1111 of the first electrodes 111 of the light-emitting elements 11 may be different. The shape of each of the first electrodes 111 is roughly hexagonal, and the first electrodes 111 are extended along the second direction Y1. For instance, the length of the first electrode main part 1111 of the first electrode 111 on the leftmost side as shown in the figure in the second direction Y1 is longer, the length of the first electrode main parts 1111 of two middle first electrodes 111 in the second direction is less than the length of the first electrode main part 1111 of the first electrode 111 on the leftmost side, and the width of the first electrode main part 1111 of the first electrode 111 in the first direction X1 is greater than the width of the first electrode main part 1111 of the first electrode 111 on the leftmost side. The shapes of the first electrode main parts 1111 of the first electrodes 111 of the light-emitting elements 11 may be designed according to more actual display requirement. The embodiment of the present disclosure is not limited thereto. For instance, the shapes of the first electrode connection parts 1112 of the first electrodes 111 of the light-emitting elements 11 may be different. Due to different positions of the first connection lines 101 or the second connection lines 102 connected with the first electrodes 111 of the light-emitting elements 11 and different shapes of the first electrode main parts 1111 of the first electrodes 111, the extension directions of the first electrode connection parts 112 or the length in the second direction Y1 is also different. For instance, the first electrode connection part 1112 of the first electrode 111 on the leftmost side in the figure is extended along the first direction X1, while the first electrode connection part 1112 of the first electrode 111 on the last but two from the left side is extended along the second direction Y1. The first electrode 111 of the light-emitting element 11 may be considered that the first electrode connection part 1112 is not arranged, for instance, the first electrodes 111 of two light-emitting elements 11 on the right side in the figure is not provided with the first electrode connection part. Because the first connection lines 101 or the second connection lines 102 connected with the first electrodes 111 of the light-emitting elements 11 are respectively disposed on two sides of the first electrodes 111 of the light-emitting elements 11, so that the length of the first electrode connection parts 1112 in the second direction Y1 is decreased (the first electrode connection part 1112 may not be arranged), and the light transmittance of the first display area is improved. For instance, FIG. 10A is a schematic plan view of a display area of the display substrate provided by at least one embodiment of the present disclosure. An A2 area in FIG. 10A is disposed at the border of the third display area 30 and the second display area 20. FIG. 10B is an enlarged view of the A2 area in FIG. 10A provided by at least one embodiment of the present disclosure. As shown in FIG. 10B, the second subpixel array (the arrangement mode of the first subpixel array is the same as that of the second subpixel array) includes a plurality of first subpixels P1, a plurality of second subpixels P2, and a plurality of third subpixels P3. Each pixel P11 of the second subpixel array includes one first subpixel P1, one second subpixel P2, and one third subpixel P3. For instance, the first subpixels P1, the second subpixels P2, and the third subpixels P3 are arranged along the first direction X1. The pixel circuit connecting hole DH1 is disposed among the first subpixels P1, the second subpixels P2, and the third subpixels P3. That is to say, each pixel of the second subpixel array includes three subpixels which are arranged along the row direction. For instance, the first subpixels P1 are green subpixels G, the second subpixels P2 are red subpixels R, and the third subpixels P3 are blue subpixels B. The arrangement mode of the pixels in the first display area 10 and the second display area 20 can improve the pixel density, namely improving the resolution of the first display area 10 and the second display area 20, and reducing the display granular sensation of the first display area 10 and the second display area 20.

For instance, as shown in FIG. 10B, the third subpixel array of the third display area 30 includes a plurality of first subpixels P1', a plurality of second subpixels P2', and a plurality of third subpixels P3'. One of two adjacent pixels of the third subpixel array, for instance, a pixel P12', includes one first subpixel P1' and one second subpixel P2', and the other one of the two adjacent pixels, for instance, a pixel P11', includes one first subpixel P1' and one third subpixel P3'; and each second subpixel P2' and each third subpixel P3' are respectively shared by at least two adjacent pixels. The arrangement mode of the pixels in the third display area 30 is different from that of the first display area 10 and the second display area 20. As described above, the resolution of the third display area 30 is higher than that of the first display area 10 and the second display area 20.

The pixel circuit of the subpixel is not limited in the embodiment of the present disclosure, for instance, may be a 2T1C (namely 2 transistors and 1 capacitor) type pixel circuit. The two transistors are respectively a data write transistor and a driving transistor. The one capacitor is a signal storage capacitor. The pixel circuit can generate a driving current that drives the light-emitting element to emit light according to received scanning signals and data signals. The light-emitting elements can generate light with different intensities according to the magnitude of the driving current. The pixel circuit, for instance, may also be other types of pixel circuits, for instance, the pixel circuit may further have compensation function, reset function, sensing function, and the like, and then the pixel circuit may include more than two thin-film transistors (TFTs).

For instance, as shown in FIGS. 9A and 9B, the display substrate 1000 further comprises a first gate insulating layer 141, a second gate insulating layer 142, and an interlayer insulating layer 143. The first pixel circuit D10 (or the second pixel circuit D20) includes a TFT 12 and a storage capacitor 13. The TFT 12 includes an active layer 121, a gate electrode 122, and source/drain electrodes (a source electrode 123 and a drain electrode 124). The storage capacitor 13 includes a first capacitor plate 131 and a second capacitor plate 132. The active layer 121 is disposed on the base substrate 14; the first gate insulating layer 141 is disposed on a side of the active layer 121 away from the base substrate 10; the gate electrode 122 and the first capacitor plate 131 are arranged in the same layer on a side of the first gate insulating layer 141 away from the base substrate 14; and the second gate insulating layer 142 is disposed on a side of the gate electrode 122 and the first capacitor plate away from the base substrate 14. The second capacitor plate 132 is disposed on a side of the second gate insulating layer 142 away from the base substrate 14. The interlayer insulating layer 143 is disposed on a side of the second capacitor plate 132 away from the base substrate 14. The source electrode 123 and the drain electrode 124 are disposed on a side of the interlayer insulating layer 143 away from the base substrate 14 and are electrically connected with the active layer 121 through via holes in the first gate insulating layer 141, the second gate insulating layer 142, and the interlayer insulating layer 143. The first transparent line layer 151 is electrically connected with one of the source/drain electrodes (electrically connected with the drain electrode 124 as shown in FIG. 9A) through the first pixel circuit connecting hole DH11 in the first planarization layer 144. The second transparent line layer 152 is electrically connected with one of the source/drain electrodes (electrically connected with the drain electrode 124 as shown in FIG. 9B) through the second pixel circuit connecting hole DH12 in the first planarization layer 144 and the second planarization layer 145.

It is to be noted that in the embodiment of the present disclosure, "arranged/provided in a/the same layer" indicates that two function layers or structural layers are provided in a same layer in the layer structure of the display substrate and formed by same materials, that is, in the manufacturing process, the two function layers or structural layers may be formed by a same material layer and may form required patterns and structures by a same patterning process. The same one patterning process, for instance, includes processes, such as photoresist forming, exposure, development, and etching.

In another example which is a variant of the example as shown in FIGS. 9A and 9B, the first capacitor plate 131 of the storage capacitor 13 is still arranged in the same layer as the gate electrode 122, and the second capacitor plate 132 of the storage capacitor 13 is arranged in the same layer as the source electrode 123 and the drain electrode 124, so the first capacitor plate 131 and the second capacitor plate 132 use a stack layer of the second gate insulating layer 142 and the interlayer insulating layer 143 as the dielectric material to form the storage capacitor.

In still another example which is a variant of the example as shown in FIGS. 9A and 9B, the first capacitor plate 131 of the storage capacitor is not arranged in the same layer as the gate electrode 223, but the first capacitor plate 131 is disposed between the second gate insulating layer 142 and the interlayer insulating layer 143, and the second capacitor plate 132 of the storage capacitor 13 is arranged in the same layer as the source electrode 123 and the drain electrode 124, so the first capacitor plate 131 and the second capacitor plate 132 adopt the interlayer insulating layer 143 as the dielectric material to form the storage capacitor.

Figure 11:
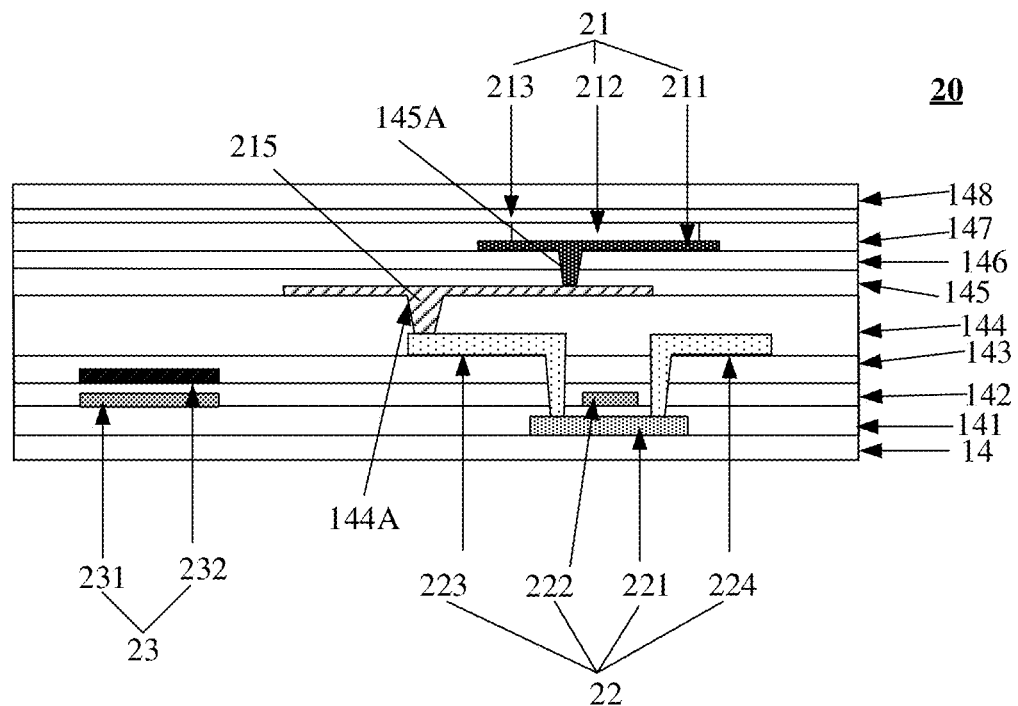
FIG. 11 is a schematic sectional view of a second display area in the display substrate provided by at least one embodiment of the present disclosure.
Figure 12:
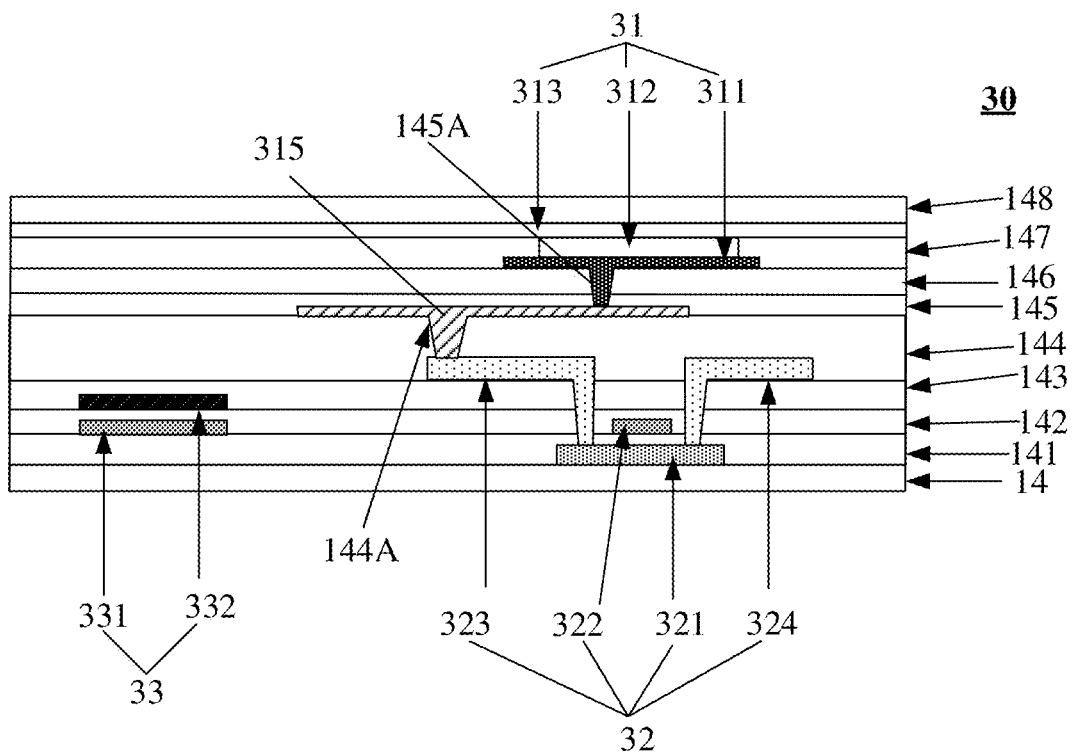
FIG. 12 is a schematic sectional view of a third display area in the display substrate provided by at least one embodiment of the present disclosure.

For instance, as shown in FIGS. 9A and 9B, the first display area 10 further includes a transparent supporting layer 191 disposed on the base substrate 14, and the light-emitting elements 11 (the first light-emitting elements 114 and the second light-emitting elements 115) are disposed on a side of the transparent supporting layer 191 away from the base substrate 14. In this way, compared with the base substrate 14, the light-emitting elements 11 in the first display area 10 can have basically the same height as third light-emitting elements 21 (as shown in FIG. 11) in the second display area 20 and fourth light-emitting elements 31 (as shown in FIG. 12) in the third display area 30, so the display effect of the display substrate can be improved.

For instance, the transparent supporting layer 191 is arranged in the same layer as at least one of the first gate insulating layer 141, the second gate insulating layer 142, the interlayer insulating layer 143, and the first planarization layer 144. For instance, the transparent supporting layer 191 is arranged in the same layer as the first gate insulating layer 141, the second gate insulating layer 142, the interlayer insulating layer 143, and the first planarization layer 144, so that the light-emitting elements 11 in the first display area 10 can have basically the same height as the third light-emitting elements 21 (as shown in FIG. 11) in the second display area 20 and the fourth light-emitting elements 31 (as shown in FIG. 12) in the third display area 30. In this way, the manufacturing process of the display substrate is simplified.

For instance, the materials of one or more of the first gate insulating layer 141, the second gate insulating layer 142, and the interlayer insulating layer 143 may include insulating materials, such as silicon oxide, silicon nitride, or silicon oxynitride. The materials of the first gate insulating layer 141, the second gate insulating layer 142, and the interlayer insulating layer 143 may be same or different.

For instance, the materials of the active layer 121 may include polysilicon or oxide semiconductor (e.g., indium gallium zinc oxide (IGZO)). The materials of the gate electrode 122 may include metal materials or alloy materials, for instance, a single-layer or multi-layer metal structure formed by molybdenum, aluminum, and titanium. For instance, the multi-layer structure is a multi-metal stack layer (e.g., a titanium, aluminum, and titanium three-layer metal stack layer (Ti/Al/Ti)). The materials of the source electrode 123 and the drain electrode 124 may include metal materials or alloy materials, for instance, a single-layer or multi-layer metal structure formed by molybdenum, aluminum, and titanium. For instance, the multi-layer structure is a multi-metal stack layer (e.g., a titanium, aluminum and titanium three-layer metal stack layer (Ti/Al/Ti)). No specific limitation will be given to the materials of the function layers in the embodiment of the present disclosure.

For instance, a passivation layer may also be disposed between the first planarization layer and the source electrode 123 and the drain electrode 124. The passivation layer may include a through hole so as to expose one of the source electrode 123 and the drain electrode 124, for instance, expose the drain electrode 124. The passivation layer can protect the source electrode 123 and the drain electrode 124 from being eroded by moisture. For instance, the materials of the passivation layer may include organic insulating materials, or inorganic insulating materials, such as silicon nitride materials. Because the silicon nitride materials have high dielectric constant and good hydrophobic function, the silicon nitride materials can well protect the first pixel circuits D10 or the second pixel circuits D20 from being eroded by moisture.

For instance, as shown in FIGS. 9A and 9B, the display substrate 1000 further comprises an encapsulation layer 148. The encapsulation layer 148 is disposed on a side of the second electrode 113 away from the base substrate 148. The encapsulation layer 148 encapsulates the light-emitting elements 11 (the first light-emitting elements 114 or the second light-emitting elements 115) so as to reduce the deterioration of the light-emitting elements 11 caused by moisture and/or oxygen in the environment. The encapsulation layer 148 may be a single-layer structure or may be a composite-layer structure. The composite-layer structure incudes a structure stacked by inorganic layers and organic layers. The encapsulation layer 148 includes at least one encapsulation sublayer. For instance, the encapsulation layer 148 may include a first inorganic encapsulation layer, a first organic encapsulation layer, and a second inorganic encapsulation layer which are arranged in turn.

For instance, the materials of the encapsulation layer 148 may include insulating materials, such as silicon nitride, silicon oxide, silicon oxynitride, and polymer resin. Inorganic materials, such as silicon nitride, silicon oxide, and silicon oxynitride, have high tightness and can prevent the erosion of water, oxygen, etc. The materials of the organic encapsulation layer may adopt polymer materials containing desiccant or polymer materials capable of blocking moisture, etc., for instance, polymer resin, or the like is used to perform planarization processing on the surface of the display substrate and relieve the stress of the first inorganic encapsulation layer and the second inorganic encapsulation layer, and may further include hygroscopic materials containing desiccant to absorb water, oxygen and other substances that intrude the inside.

For instance, FIG. 11 is a schematic sectional view of the second display area in the display substrate provided by at least one embodiment of the present disclosure. FIG. 12 is a schematic sectional view of the third display area in the display substate provided by at least one embodiment of the present disclosure.

For instance, as shown in FIG. 11, each of the plurality of first pixel units P in the second display area 20 of the display substrate 1000 includes a third light-emitting element 21 and a third pixel circuit, and the third pixel circuit is electrically connected with the third light-emitting element 21 to drive the third light-emitting element 21. For instance, the second pixel circuit includes structures, such as a TFT 22 and a storage capacitor 23. The third light-emitting element 21 includes a third electrode 211, a fourth electrode 213, and a second light-emitting layer 212 between the third electrode 211 and the fourth electrode 213. The third electrode 211 is electrically connected with the third pixel circuit through a via hole. For instance, the third electrode 211 is an anode of the third light-emitting element 21, and the fourth electrode 213 is a cathode of the third light-emitting element 21. The PDL 147 is disposed on a side of the third electrode 211 away from the base substrate 14 and includes a plurality of openings. The second light-emitting layer 212 is disposed in the plurality of openings of the PDL 147. The fourth electrode 213 is disposed on a side of the second light-emitting layer 212 and the PDL 147 away from the base substrate 14. The third electrode 211 and the first electrode 111 are arranged in the same layer and made from a same material, and the fourth electrode 213 and the second electrode 113 are arranged in the same layer and made from a same material. The second light-emitting layer 212 and the first light-emitting layer 112 are arranged in the same layer and made from a same material.

For instance, the TFT 22 includes structures, such as an active layer 221, a gate electrode 222, source/drain electrodes (namely a source electrode 223 and a drain electrode 224) and a first switching electrode 215, and the storage capacitor 23 includes a first capacitor plate 231 and a second capacitor plate 232. The active layer 221 is disposed on the base substrate 14; the first gate insulating layer 141 is disposed on a side of the active layer 221 away from the base substrate 14; the gate electrode 222 and the first capacitor plate 231 are arranged in the same layer on a side of the first gate insulating layer 141 away from the base substrate 14; the second gate insulating layer 142 is disposed on a side of the gate electrode 222 and the first capacitor plate 231 away from the base substrate 14; the second capacitor plate 232 is disposed on a side of the second gate insulating layer 142 away from the base substrate 14; the interlayer insulating layer 143 is disposed on a side of the second capacitor plate 232 away from the base substrate 14; the source/drain electrodes are disposed on a side of the interlayer insulating layer 143 away from the base substrate 14 and electrically connected with the active layer 221 through via holes in the first gate insulating layer 141, the second gate insulating layer 142, and the interlayer insulating layer 143; and the first planarization layer 144 is disposed on a side of the source/drain electrodes away from the base substrate 14 to provide a first planarization surface to planarize the third pixel circuit.

For instance, the active layer 221, the gate electrode 222, and the source/drain electrodes (namely the source electrode 223 and the drain electrode 224) of the TFT 22 are respectively arranged in the same layer and made from same materials as the active layer 121, the gate electrode 122, and the source/drain electrodes (the source electrode 123 and the drain electrode 124) of the TFT 12. The first capacitor plate 231 and the second capacitor plate 232 of the storage capacitor 23 are respectively arranged in same layers and made from same materials as the first capacitor plate 131 and the second capacitor plate 132 of the storage capacitor 13.

For instance, as shown in FIG. 11, a first via hole 144A is formed in the first planarization layer 144, and the first switching electrode 215 is disposed on a side of the first planarization layer 144 away from the base substrate 14 and electrically connected with the source electrode 223 (or the drain electrode 224) of the source/drain electrodes through the first via hole 144A. The second planarization layer 145 and the third planarization layer 146 are provided with a second via hole 145A, and the fourth electrode 213 of the third light-emitting element 21 is electrically connected with the first switching electrode 215 through the second via hole 145A.

For instance, in other embodiments, the first switching electrode 215 may also be disposed on a side of the second planarization layer 145 away from the base substrate 14. In this case, the first via hole 144A runs through the first planarization layer 144 and the second planarization layer 145, and the second via hole 145A runs through the third planarization layer 146.

For instance, as shown in FIG. 12, each of the plurality of second pixel units C of the third display area 30 of the display substrate 1000 includes a fourth light-emitting element 31 and a fourth pixel circuit, and the fourth pixel circuit is electrically connected with the fourth light-emitting element 31 to drive the fourth light-emitting element 31. For instance, the fourth pixel circuit includes structures, such as a TFT 32 and a storage capacitor 33. The fourth light-emitting element 31 includes a fifth electrode 311, a sixth electrode 313, and a third light-emitting layer 312 between the fifth electrode 311 and the sixth electrode 313. The fifth electrode 311 is electrically connected with the fourth pixel circuit through a via hole. For instance, the fifth electrode 311 is an anode of the fourth light-emitting element 31, and the sixth electrode 313 is a cathode of the fourth light-emitting element 31. The PDL 147 is disposed on a side of the fifth electrode 311 away from the base substrate 14 and includes a plurality of openings. The third light-emitting layer 312 is disposed in the plurality of openings of the PDL 147. The sixth electrode 313 is disposed on a side of the third light-emitting layer 312 and the PDL 147 away from the base substrate 14. The fifth electrode 311 and the first electrode 111 are arranged in the same layer and made from a same material, and the sixth electrode 213 and the second electrode 113 are arranged in the same layer and made from a same material. The third light-emitting element 312 and the first light-emitting layer 112 are arranged in the same layer and made from a same material.

For instance, the TFT 32 includes structures, such as an active layer 321, a gate electrode 322, source/drain electrodes (namely a source electrode 323 and a drain electrode 324) and a first switching electrode 315, and the storage capacitor 33 includes a first capacitor plate 331 and a second capacitor plate 332. The active layer 321 is disposed on the base substrate 14; the first gate insulating layer 141 is disposed on a side of the active layer 321 away from the base substrate 14; the gate electrode 322 and the first capacitor plate 331 are arranged in the same layer on a side of the first gate insulating layer 141 away from the base substrate 14; the second gate insulating layer 142 is disposed on a side of the gate electrode 322 and the first capacitor plate 331 away from the base substrate 14; the second capacitor plate 332 is disposed on a side of the second gate insulating layer 142 away from the base substrate 14; the interlayer insulating layer 143 is disposed on a side of the second capacitor plate 332 away from the base substrate 14; the source/drain electrodes are disposed on a side of the interlayer insulating layer 143 away from the base substrate and are electrically connected with the active layer 221 through via holes in the first gate insulating layer 141, the second gate insulating layer 142, and the interlayer insulating layer 143; and the first planarization layer 144 is disposed on a side of the source/drain electrodes away from the base substrate 14 to provide a first planarization surface to planarize the third pixel circuit.

For instance, the active layer 321, the gate electrode 322, and the source/drain electrodes (namely the source electrode 323 and the drain electrode 324) of the TFT 32 are respectively arranged in same layers and made from same materials as the active layer 121, the gate electrode 122, and the source/drain electrodes (the source electrode 123 and the drain electrode 124) of the TFT 12. The first capacitor plate 331 and the second capacitor plate 332 of the storage capacitor 33 are respectively arranged in same layers and made from same materials as the first capacitor plate 131 and the second capacitor plate 132 of the storage capacitor 13.

For instance, as shown in FIG. 12, a first via hole 144A is formed in the first planarization layer 144, and the first switching electrode 315 is disposed on a side of the first planarization layer 144 away from the base substrate 14 and electrically connected with the source electrode 323 (or the drain electrode 324) of the source/drain electrodes through the first via hole 144A. The second planarization layer 145 and the third planarization layer 146 are provided with a second via hole 145A, and the sixth electrode 313 of the fourth light-emitting element 31 is electrically connected with the first switching electrode 315 through the second via hole 145A.

For instance, in other embodiments, the first switching electrode 315 may also be disposed on a side of the second planarization layer 145 away from the base substrate 14. In this case, the first via hole 144A runs through the first planarization layer 144 and the second planarization layer 145, and the second via hole 145A runs through the third planarization layer 146.

It is to be noted that the first pixel circuit, the second pixel circuit and the third pixel circuit in the second display area 20 have same structure as the fourth pixel circuit in the third display area 30 and can be formed by a same patterning process in the manufacturing process. For instance, the first gate insulating layer 141, the second gate insulating layer 142, the interlayer insulating layer 143, the first planarization layer 144, the second planarization layer 145, the third planarization layer 146, the PDL 147, and the encapsulation layer 148 are arranged in a same layer in the second display area 20 and the third display area 30, and they are integral structure in some embodiments, for instance, they are the same insulating layer, so, a same reference numeral is used in the drawings.

For instance, as shown in FIGS. 9A, 9B, 11, and 12, the base substrate 14 may be a glass plate, a quartz plate, a metal plate, a resin plate, etc. For instance, the materials of the base substrate may include organic materials. For instance, the organic materials may be polyimide, polycarbonate, polyacrylate, polyetherimide, polyether sulfone, polyethylene terephthalate (PET), polyethylene naphthalate (PEN), or other resin materials. For instance, the base substrate 14 may be a flexible substrate or an inflexible substrate. No limitation will be given here in the embodiment of the present disclosure.

Figure 13:
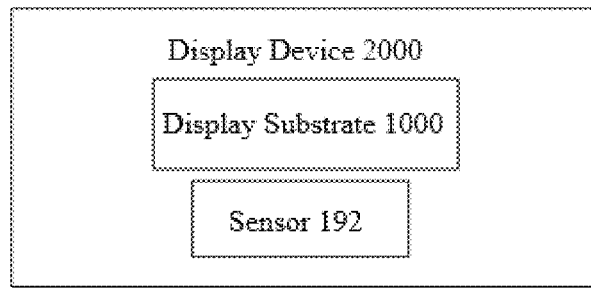
FIG. 13 is a schematic diagram of a display device provided by at least one embodiment of the present disclosure.

FIG. 13 is a schematic diagram of a display device provided by at least one embodiment of the present disclosure. At least one embodiment of the present disclosure provides a display device 2000 which may comprise the display substrate 1000 provided by any of the embodiments.

For instance, as shown in FIG. 13, the display device 2000 may further comprise a flexible circuit board and a control chip. For instance, the flexible circuit board is bonded to a bonding area of the display substrate 1000, and the control chip is mounted on the flexible circuit board and then electrically connected with the display area; or the control chip is directly bonded to the bonding area and then electrically connected with the display area.

For instance, the control chip may be a central processing unit (CPU), a digital signal processor (DSP), a system-on-chip (SoC), etc. For instance, the control chip may further include a memory, and it may further include a power module, etc., which can realize power supply and signal input and output functions through additionally arranged leads, signal lines, etc. For instance, the control chip may further include a hardware circuit, computer executable codes, etc. The hardware circuit may include a general very large-scale integration (VLSI) circuit or a gate array and the conventional semiconductor or other separate elements, such as a logic chip and a transistor. The hardware circuit may further include a field programmable gate array, a programmable logic array, a programmable logic device, etc.

For instance, the display device 2000 provided by at least one embodiment of the present disclosure may be any product or component with display function, such as an OLED panel, an OLED TV, a QLED panel, a QLED TV, a mobile phone, a tablet, a notebook computer, a digital album, or a navigator. The display device 2000 may further comprise other components, such as a data drive circuit and a timing controller. No limitation will be given here in the embodiment of the present disclosure.

For instance, as shown in FIGS. 3B, 9A and 9B, the display device 2000 further comprises a sensor 192. The sensor 192 is disposed on a second side S2 (for instance, a non-display side) of the display substrate 1000. The sensor 192 is configured to receive light (for instance, collimated light) from a first side S1 (for instance, a display side of the display substrate) of the display substrate 1000. An orthographic projection of the sensor 192 on the base substrate 14 is at least partially overlapped with the first display area 10.

For instance, the sensor 192 is an image sensor, an infrared sensor, a distance sensor, etc. The sensor 192, for instance, may be implemented as a chip, etc. The sensor 192 is disposed on the non-display side S2 (a side away from the user) of the display substrate.

For instance, the sensor 192 and the first display area 10 are at least partially overlapped in the normal direction of the display surface of the display substrate.

For instance, the sensor 192 may be an image sensor and may be configured to acquire an image of an external environment with which a light-gathering surface of the sensor 192 faces, and for instance, the sensor 192 may be a CMOS image sensor or a CCD image sensor; and the sensor 192 may also be an infrared sensor, a distance sensor, etc. The sensor 192 may be configured to implement a camera of a mobile terminal, such as a mobile phone or a notebook computer, and the sensor may also include optics, such as a lens, a reflecting mirror, or an optical waveguide, as required to modulate an optical path. The type, the function, and the arrangement way of the sensor 192 are not limited in the embodiment of the present disclosure.

The sensor 192 is disposed on the non-display side S2 of the display panel by double-faced adhesive tape, etc. Moreover, an orthographic projection of the sensor 192 on the base substrate 14 is at least partially overlapped with the first display area 10 and is configured to receive light from the first side S1. In this way, the first display area 10 can realize display and provide convenience for the arrangement of the sensor 192.

It is to be noted that for clear and concise description, not all the components of the display device are provided in the embodiments of the present disclosure. In order to implement the substrate functions of the display device, those skilled in the art can provide and arrange other components not shown in the description in accordance with the specific requirements, which are not limited in the embodiments of the present disclosure.

The technical effects of the display device provided by the above embodiments can refer to the technical effects of the display substrate provided by the embodiments of the present disclosure. No further description will be repeated herein.

The following points should be noted:

(1) The accompanying drawings involve only the structure(s) in connection with the embodiment(s) of the present disclosure, and other structure(s) can be referred to common design(s).

(2) Without conflicting with each other, features in one embodiment or in different embodiments can be combined to obtain new embodiments.

The above description is only the exemplary implementations of the present disclosure, and the scope of the present disclosure is not limited thereto. Any changes or substitutions readily conceived by those skilled in the art within the technical scope of the embodiments of the present disclosure shall fall within the scope of the present disclosure. The scope of the present disclosure should be defined by the claims.

What is claimed is:

1. A display substrate, comprising: a first side for display and a second side opposite to the first side;
   a base substrate including a display area including a first display area and a second display area which surrounds the first display area in part or totally,
   wherein the first display area includes a first subpixel array and allows light from the first side of the display substrate to be transmitted to the second side of the display substrate, the first subpixel array includes a plurality of light-emitting elements arranged in an array, and the plurality of light-emitting elements include a plurality of first light-emitting elements and a plurality of second light-emitting elements;
   the second display area includes a first pixel circuit array which includes a plurality of first pixel circuit units, and the plurality of first pixel circuit units include a plurality of first pixel circuits and a plurality of second pixel circuits;
   a plurality of first connection lines which are at least partially extended along a first direction and connected with the plurality of first pixel circuits and the plurality of first light-emitting elements in one-to-one correspondence, and the first pixel circuit is configured to drive the first light-emitting elements through the first connection lines; and
   a plurality of second connection lines which are at least partially extended along the first direction and connected with the plurality of second pixel circuits and the plurality of second light-emitting elements in one-to-one correspondence, and the second pixel circuit is configured to drive the second light-emitting elements through the second connection lines;
   each of the plurality of light-emitting elements includes a first electrode, and the first electrodes of the plurality of first light-emitting elements and the plurality of second light-emitting elements are arranged in the same row along the first direction;
   in the first display area, the plurality of first connection lines are at least partially provided on a first side of a row provided with the first electrodes of the plurality of first light-emitting elements and the plurality of second light-emitting elements in a second direction, and the plurality of first connection lines are at least partially provided on a second side of the row provided with the first electrodes of the plurality of first light-emitting elements and the plurality of second light-emitting elements in a second direction;
   wherein the second direction is intercrossed with the first direction, and the first side and the second side of the row provided with the first electrodes of the plurality of first light-emitting elements and the plurality of second light-emitting elements are opposite to each other in the second direction;
   the plurality of first pixel circuits and the plurality of second pixel circuits are provided in a same row, the plurality of first connection lines and the plurality of second connection lines are not crossed with each other, respectively, an end of at least one of the plurality of first connection lines is connected with a corresponding first light-emitting element, and extends from the first side to the second display area in the first direction, and extends from a side of a row where the plurality of first pixel circuits are located to a second side of the row where the plurality of first pixel circuits are located in the second direction opposite to the first direction, to connect to a corresponding first pixel circuit.

2. The display substrate according to claim 1, wherein, in the first direction, the plurality of first light-emitting elements are provided on a side of the plurality of second light-emitting elements near the second display area.

3. The display substrate according to claim 1, wherein each of the plurality of first connection lines includes a first main part and at least one first bending part;
   the first main part is extended along the first direction and disposed on the first side of the row provided with the first electrodes of the plurality of first light-emitting elements and the plurality of second light-emitting elements, and the first main parts are connected with the first electrodes of the plurality of first light-emitting elements in one-to-one correspondence;
   the at least one first bending part is connected with the first pixel circuit and the first main parts respectively and is extended to the first side of the first pixel circuit from the first pixel circuit so that the first main parts are away from the first electrodes of the plurality of the first light-emitting elements in the first display area.

4. The display substrate according to claim 3, wherein the at least one first bending part is at least partially extended towards the first side of the first pixel circuit along a third direction; and
   the third direction is intercrossed with the first direction and the second direction.

5. The display substrate according to claim 4, wherein the at least one first bending part of at least one of the plurality of first connection lines includes a first bending sub-part;
   the first bending sub-part is disposed on the first side of the first pixel circuit, the first bending sub-part is extended along the third direction and connected with the first pixel circuit and the first main part; and
   one of the first pixel circuits connected with the first bending sub-part is adjacent to the second pixel circuit.

6. The display substrate according to claim 5, wherein the at least one first bending part of the at least one of the plurality of first connection lines includes a second bending sub-part, a third bending sub-part, a first connection sub-part, and a second connection sub-part, wherein
   the first connection sub-part and the second bending sub-part are disposed on the second side of the first pixel circuit, the second bending sub-part is extended along the third direction, and the first connection sub-part is extended along the first direction and connected with the first pixel circuit and the second bending sub-part;
   the second connection sub-part is extended along the second direction and disposed between the first pixel circuit and the second subpixel circuit which are adjacent to each other and is connected with the second bending sub-part and the third bending sub-part;
   the third bending sub-part is disposed on the first side of the first pixel circuit and is extended along the third direction and is connected with the first main part of the first connection line; and
   the second side and the first side of the first pixel circuit are opposite to each other in the second direction.

7. The display substrate according to claim 4, wherein the at least one first bending part of at least one of the plurality of first connection lines is extended to the first side of the first pixel circuit from a second side of the first pixel circuit and includes a second bending sub-part, a third bending sub-part, a first connection sub-part, and a second connection sub-part;
   the first connection sub-part and the second bending sub-part are disposed on the second side of the first pixel circuit, the second bending sub-part is extended along the third direction, and the first connection sub-part is extended along the first direction and connected with the first pixel circuit and the second bending sub-part;

the second connection sub-part is extended along the second direction and disposed between two adjacent first pixel circuits and is connected with the second bending sub-part and the third bending sub-part;

the third bending sub-part is disposed on the first side of the first pixel circuit and is extended along the third direction and connected with the first main part of the first connection line; and the second side and the first side of the first pixel circuit are opposite to each other in the second direction.

8. The display substrate according to claim 3, wherein each of the plurality of second connection lines includes a second main part;

the second main part is extended along the first direction and is disposed on the second side of the row provided with the first electrodes of the plurality of first light-emitting elements and the plurality of second light-emitting elements and is connected with the first electrode of the second light-emitting element and the second pixel circuit; and in the first display area, an orthographic projection of the main part of the second connection line on the base substrate is overlapped with an orthographic projection of the first electrode of at least one of the plurality of second light-emitting elements and the plurality of first light-emitting elements on the base substrate.

9. The display substrate according to claim 8, wherein the first main parts of the plurality of first connection lines are parallel to the second main parts of the plurality of second connection lines in the first direction.

10. The display substrate according to claim 1, wherein the plurality of first connection lines and the plurality of second connection lines are transparent conductive lines.

11. The display substrate according to claim 10, further comprising a first insulating layer, a second insulating layer, a third insulating layer, a first transparent line layer, and a second transparent line layer, wherein the first insulating layer is disposed on a side of the plurality of first pixel circuits and the plurality of second pixel circuits away from the base substrate, the second insulating layer is disposed on a side of the first insulating layer away from the base substrate, the third insulating layer is disposed on a side of the second insulating layer away from the base substrate, the first transparent line layer is disposed between the first insulating layer and the second insulating layer, the second transparent line layer is disposed on the side of the second insulating layer away from the base substrate, and the first electrodes of the plurality of first light-emitting elements are disposed on a side of the third insulating layer away from the base substrate;

the first transparent line layer includes one of two adjacent first connection lines of the plurality of first connection lines and one of two adjacent second connection lines of the plurality of second connection lines, and the second transparent line layer includes the other one of the two adjacent first connection lines of the plurality of first connection lines and the other one of the two adjacent second connection lines of the plurality of second connection lines.

12. The display substrate according to claim 11, further comprising a plurality of pixel circuit connecting holes which are formed in the second display area and include a plurality of first pixel circuit connecting holes and a plurality of second pixel circuit connecting holes, wherein the first pixel circuit connecting hole runs through the first insulating layer, the second pixel circuit connecting hole runs through the first insulating layer and the second insulating layer;

the first connection line and the second connection line disposed on the first transparent line layer are respectively connected with the first pixel circuit and the second pixel circuit through the first pixel circuit connecting hole; and the first connection line and the second connection line disposed on the second transparent line layer are respectively connected with the first pixel circuit and the second pixel circuit through the second pixel circuit connecting hole.

13. The display substrate according to claim 11, further comprising a plurality of electrode connecting holes which are formed in the first display area and are disposed on the first side of the row provided with the first electrodes of the plurality of first light-emitting elements and the plurality of second light-emitting elements and include a plurality of first electrode connecting holes and a plurality of second electrode connecting holes, wherein each of the first electrode connecting holes runs through the second insulating layer and the third insulating layer, and each of the second electrode connecting hole runs through the third insulating layer;

the first connection line and the second connection line disposed on the first transparent line layer are respectively connected with the first electrodes of the first light-emitting element and the second light-emitting element through the first electrode connecting holes, respectively; and the first connection line and the second connection line disposed on the second transparent line layer are respectively connected with the first electrodes of the first light-emitting element and the second light-emitting element through the second electrode connecting holes.

14. The display substrate according to claim 13, further comprising at least one first virtual line disposed in the first display area, wherein the at least one first virtual line is disposed between the first electrodes of the plurality of first light-emitting elements and the plurality of second light-emitting elements in adjacent rows and is extended along the second direction;

the at least one first virtual line is connected with one end of the second connection line connected with the electrode connecting hole and is extended towards a direction away from the first electrode of the second light-emitting element from the electrode connecting hole; and an orthographic projection of the at least one first virtual line on the base substrate is not overlapped with the first connection line and the second connection line.

15. The display substrate according to claim 11, further comprising a pixel define layer (PDL), wherein the PDL is disposed on a side of the first electrodes of the plurality of light-emitting elements away from the base substrate and includes a plurality of first pixel openings, the plurality of first pixel openings correspond to the plurality of light-emitting elements one to one, respectively, to form light-emitting areas of the plurality of light-emitting elements;

each of the plurality of light-emitting elements further includes a first light-emitting layer and a second electrode, the second electrode is disposed on a side of the PDL away from the base substrate, and the first light-emitting layer is disposed in the first pixel openings and disposed between the first electrode and the second electrode;

the first electrode of at least part of the plurality of light-emitting elements includes a first electrode main part and a first electrode connection part; and the first electrode main part is disposed in the light-emitting area of the light-emitting element, and the first electrode connection part is connected with the electrode connecting hole and the first electrode main part.

16. The display substrate according to claim 1, wherein the second display area further includes a second subpixel array which includes a plurality of first pixel units, and the plurality of first pixel units and the plurality of first pixel circuit units are alternately arranged;

each of the plurality of first pixel units includes a third light-emitting element and a third pixel circuit, and the third pixel circuit is electrically connected with the third light-emitting element to drive the third light-emitting element;

the first subpixel array and the second subpixel array include a plurality of first subpixels, a plurality of second subpixels, and a plurality of third subpixels; and each pixel of the first subpixel array and the second subpixel array includes at least one first subpixel, at least one second subpixel, and at least one third subpixel.

17. The display substrate according to claim 16, wherein the first subpixels are green subpixels, the second subpixels are red subpixels, and the third subpixels are blue subpixels.

18. The display substrate according to claim 1, wherein the display area further includes a third display area, the third display area surrounds the second display area in part or totally, and includes a third subpixel array which includes a plurality of second pixel units;

each of the plurality of second pixel units includes a fourth light-emitting element and a fourth pixel circuit, the fourth pixel circuit is electrically connected with the fourth light-emitting element to drive the fourth light-emitting element;

the third subpixel array includes a plurality of first subpixels, a plurality of second subpixels, and a plurality of third subpixels;

one of two adjacent pixels of the third subpixel array includes at least one first subpixel and at least one second subpixel, and the other one of the two adjacent pixels includes at least one first subpixel and at least one third subpixel, and each second subpixel and each third subpixel are respectively shared by at least two adjacent pixels.

19. A display device, comprising a display substrate, wherein the display substrate comprises:

a first side for display and a second side opposite to the first side;

a base substrate including a display area including a first display area and a second display area which surrounds the first display area in part or totally, wherein the first display area includes a first subpixel array and allows light from the first side of the display substrate to be transmitted to the second side of the display substrate, the first subpixel array includes a plurality of light-emitting elements arranged in an array, and the plurality of light-emitting elements include a plurality of first light-emitting elements and a plurality of second light-emitting elements;

the second display area includes a first pixel circuit array which includes a plurality of first pixel circuit units, and the plurality of first pixel circuit units include a plurality of first pixel circuits and a plurality of second pixel circuits;

a plurality of first connection lines which are at least partially extended along a first direction and connected with the plurality of first pixel circuits and the plurality of first light-emitting elements in one-to-one correspondence, and the first pixel circuit is configured to drive the first light-emitting elements through the first connection lines; and a plurality of second connection lines which are at least partially extended along the first direction and connected with the plurality of second pixel circuits and the plurality of second light-emitting elements in one-to-one correspondence, and the second pixel circuit is configured to drive the second light-emitting elements through the second connection lines;

each of the plurality of light-emitting elements includes a first electrode, and the first electrodes of the plurality of first light-emitting elements and the plurality of second light-emitting elements are arranged in the same row along the first direction;

in the first display area, the plurality of first connection lines are at least partially provided on a first side of a row provided with the first electrodes of the plurality of first light-emitting elements and the plurality of second light-emitting elements in a second direction, and the plurality of first connection lines are at least partially provided on a second side of the row provided with the first electrodes of the plurality of first light-emitting elements and the plurality of second light-emitting elements in a second direction;

wherein the second direction is intercrossed with the first direction, and the first side and the second side of the row provided with the first electrodes of the plurality of first light-emitting elements and the plurality of second light-emitting elements are opposite to each other in the second direction;

the plurality of first pixel circuits and the plurality of second pixel circuits are provided in a same row, the plurality of first connection lines and the plurality of second connection lines are not crossed with each other, respectively, an end of at least one of the plurality of first connection lines is connected with a corresponding first light-emitting element, and extends from the first side to the second display area in the first direction, and extends from a side of a row where the plurality of first pixel circuits are located to a second side of the row where the plurality of first pixel circuits are located in the second direction opposite to the first direction, to connect to a corresponding first pixel circuit.

20. The display device according to claim 19, further comprising a sensor, wherein the sensor is disposed on the second side of the display substrate and is configured to receive light from the first side of the display substrate, wherein an orthographic projection of the sensor on the base substrate is at least partially overlapped with the first display area.

* * * * *